(12) United States Patent
Cole

(10) Patent No.: US 12,332,297 B2
(45) Date of Patent: Jun. 17, 2025

(54) TEST SYSTEM

(71) Applicant: TeraView Limited, Cambridge (GB)

(72) Inventor: Bryan Edward Cole, Cambridge (GB)

(73) Assignee: Tera View Limited, Cambridge (GB)

( * ) Notice: Subject to any disclaimer, the term of this patent is extended or adjusted under 35 U.S.C. 154(b) by 0 days.

(21) Appl. No.: 18/335,360

(22) Filed: Jun. 15, 2023

(65) Prior Publication Data

US 2023/0324452 A1 Oct. 12, 2023

Related U.S. Application Data

(60) Continuation of application No. 17/495,399, filed on Oct. 6, 2021, now Pat. No. 11,726,136, which is a (Continued)

(30) Foreign Application Priority Data

Feb. 11, 2011 (GB) ..................................... 1102507

(51) Int. Cl.
| | |
|---|---|
| *G01R 31/28* | (2006.01) |
| *G01R 31/11* | (2006.01) |
| *G01R 31/308* | (2006.01) |

(52) U.S. Cl.
CPC ............. *G01R 31/28* (2013.01); *G01R 31/11* (2013.01); *G01R 31/2822* (2013.01); *G01R 31/308* (2013.01)

(58) Field of Classification Search
CPC ........ G01R 27/06; G01R 31/11; G01R 31/28; G01R 31/2822; G01R 31/2841; (Continued)

(56) References Cited

U.S. PATENT DOCUMENTS 4,482,863 A * 11/1984 Auston ................ G01R 31/308
324/762.01
4,681,449 A 7/1987 Bloom et al.
(Continued)

FOREIGN PATENT DOCUMENTS

| FR | 2892824 A1 | 5/2007 |
| JP | 49-60409 | 6/1974 |
(Continued)

OTHER PUBLICATIONS

Shank et al. Ultrafast Phenomena in Semiconductor Devices, Science vol. 215, Dec. 2, 1982, pp. 797-801 (Year: 1982).*
(Continued)

*Primary Examiner* — Alesa Allgood
*Assistant Examiner* — Courtney G McDonnough
(74) *Attorney, Agent, or Firm* — Blank Rome LLP

(57) ABSTRACT

A reflectometer for allowing a test of a device, the reflectometer comprising: a source of pulsed radiation; a first photoconductive element configured to output a pulse in response to irradiation from the pulsed source; a second photoconductive element configured to receive a pulse; and a transmission line arrangement configured to direct the pulse from the first photoconductive element to the device under test and to direct the pulse reflected from the device under test to the second photoconductive element. At least one of the first and second photoconductive elements is provided on a different substrate to that of the transmission line arrangement.

9 Claims, 12 Drawing Sheets

Related U.S. Application Data continuation of application No. 15/991,543, filed on May 29, 2018, now Pat. No. 11,169,202, which is a division of application No. 13/984,980, filed as application No. PCT/GB2012/050313 on Feb. 13, 2012, now Pat. No. 10,006,960.

(58) Field of Classification Search
CPC ............ G01R 31/308; G01R 31/31713; G01R 31/31717; G01R 31/31723
USPC .......................................................... 324/537
See application file for complete search history.

(56) References Cited

U.S. PATENT DOCUMENTS

| | | | |
|---|---|---|---|
| 4,745,361 A | 5/1988 | Nees et al. | |
| 4,896,109 A | 1/1990 | Rauscher | |
| 4,896,409 A | 1/1990 | Rosch et al. | |
| 5,142,224 A | 8/1992 | Smith et al. | |
| 5,258,648 A | 11/1993 | Lin | |
| 5,347,241 A | 9/1994 | Panaretos et al. | |
| 5,767,955 A | 6/1998 | Konno et al. | |
| 6,064,054 A | 5/2000 | Waczynski et al. | |
| 6,501,288 B1 | 12/2002 | Wilsher | |
| 7,132,845 B1 | 11/2006 | Lamson | |
| 7,532,011 B2 | 5/2009 | Shi | |
| 2002/0089335 A1 | 7/2002 | Williams | |
| 2005/0142946 A1 | 6/2005 | Baek et al. | |
| 2005/0213895 A1 | 9/2005 | Sabbatino | |
| 2006/0146334 A1 | 7/2006 | Cluff et al. | |
| 2006/0291114 A1 | 12/2006 | Teo et al. | |
| 2008/0224071 A1 | 9/2008 | Kasai et al. | |
| 2009/0073053 A1 | 3/2009 | Nevo | |
| 2011/0011730 A1 | 1/2011 | Ojefors | |
| 2013/0056673 A1 | 3/2013 | Yang | |

FOREIGN PATENT DOCUMENTS

| | | |
|---|---|---|
| JP | 53-114040 | 10/1978 |
| JP | 2-191349 | 7/1990 |
| JP | 08-233879 | 9/1996 |
| JP | 8-233879 A | 9/1996 |
| JP | 2000-97846 | 4/2000 |
| JP | 2005-94314 | 4/2005 |
| JP | 2005-197219 A | 7/2005 |
| JP | 2006-108556 | 4/2006 |
| JP | 2008-224436 A | 9/2008 |
| JP | 2009-216565 A | 9/2009 |
| WO | WO-01/96887 A2 | 12/2001 |
| WO | WO-2006/117388 A1 | 11/2006 |

OTHER PUBLICATIONS

Slotboom "Characterization of gap-discontinuities in microstrip structures, used for opto-electronic microwave switching", Thesis, Eindhoven University of Technology, pp. 1-81 (Year: 1992).*

N.G. Paulter et al., "Optoelectronic Measurements of Picosecond Electrical Pulse Propagation in Coplanar Waveguide Transmission Lines", IEE Transactions of Microwave Theory and Techniques, vol. 37, No. 10, Oct. 1, 1989, pp. 1612-1619.

W.R. Eisenstadt et al., "On-Chip Picosecond Time-Domain Measurements for VLSli and Interconnect Testing Using Photoconductors", IEEE Transactions on Electron Devices, vol. ED-32, No. 2, Feb. 1985.

D.H. Auston, "Impulse Response of Photoconductors in Transmission Lines", IEEE Journal of Quantum Electronics, vol. QE-19, No. 4, Apr. 1983.

* cited by examiner

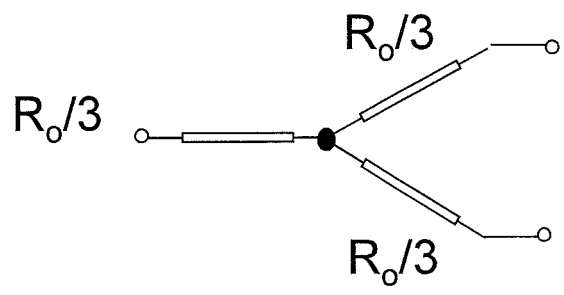
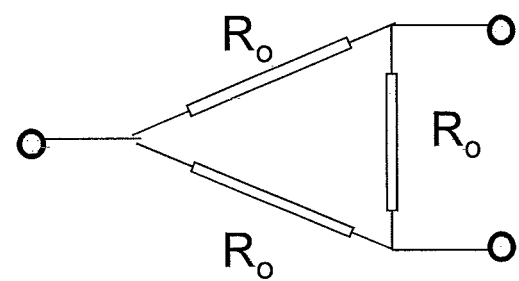
Figure 18a
Figure 18b
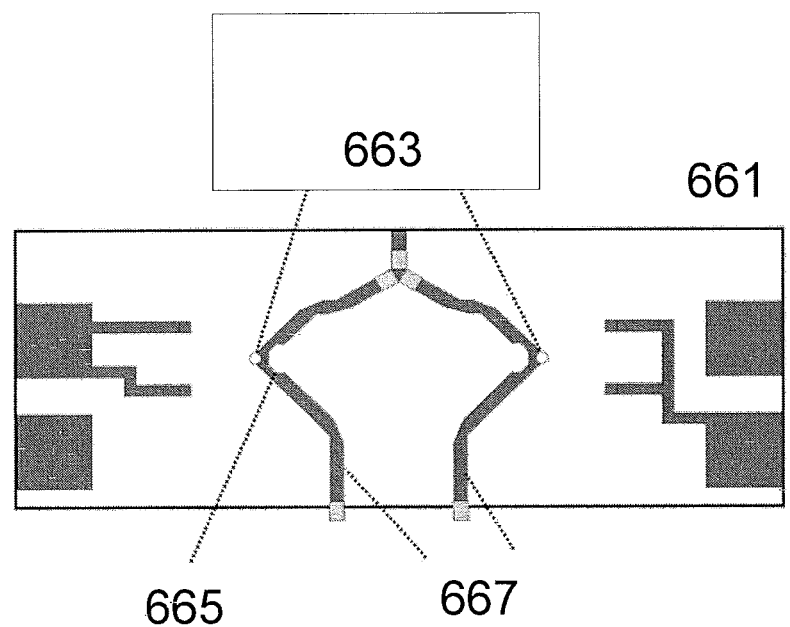
Figure 19

TEST SYSTEM

This is a continuation of U.S. patent application Ser. No. 17/495,399, filed Oct. 6, 2021, which is a continuation of U.S. patent application Ser. No. 15/991,543, filed May 29, 2018, now U.S. Pat. No. 11,169,202, which is a divisional of U.S. patent application Ser. No. 13/984,980, filed Oct. 7, 2013, now U.S. Pat. No. 10,006,960, which is a 371 of International Application No. PCT/GB2012/050313, filed Feb. 13, 2012, which claims priority to UK Application No. 1102507.9, filed Feb. 11, 2011, the entire disclosures of which are incorporated by reference in their entireties.

BACKGROUND OF THE INVENTION

1. Field of the Invention

The present invention is generally concerned with the field of test systems. More specifically those for testing the integrity of an electronic device.

2. Description of the Related Art

Time domain reflectometers (TDRs) are used to test the integrity of cables, printed circuit boards, electronic devices and the like. They operate by transmitting a short rise time pulse through an object to be tested, usually the object is referred to as the "Device Under Test" or DUT. If the DUT has any breaks or short circuits in its wiring then the pulse will be at least partially reflected. If no defects are present and device wiring is properly terminated, then the pulse will not be reflected.

It has previously been suggested to perform TDR using pulses see for example, U.S. Pat. No. 7,280,190 which uses THz transmitters and receivers built on Electro-optic sampling technology.

SUMMARY OF THE INVENTION

The present invention provides a system to perform TDR or a reflectometer which uses photoconductive elements as the receivers and generators and, in a first aspect, the present invention provides a reflectometer for allowing a test of a device, the reflectometer comprising:
 a source of pulsed radiation;
 a first photoconductive element configured to output a pulse in response to irradiation from said pulsed source;
 a second photoconductive element configured to receive a pulse;
 a transmission line arrangement configured to direct the pulse from the first photoconductive element to the device under test and to direct the pulse reflected from the device under test to the second photoconductive element; and
 a termination resistance provided for said transmission line configured to match the impedance of the transmission line.

In an embodiment, the pulses outputted by the first photoconductive element are in the frequency range from 10 GHz to 10 THz. In a further embodiment, the frequency range is from 50 GHz to 500 GHz.

In an embodiment, the photoconductive elements (PCEs) are integrated with a microstrip or co-planar transmission line on a separate substrate. It is desirable to avoid back reflections from the waveguides causing artefacts in the signal from the DUT.

To at least partially address this problem, in an embodiment matching resistors are provided onto at least one of the generator and receiver such that signal incident onto the generator and/or receiver along the microstrip are substantially absorbed.

In U.S. Pat. No. 4,896,109, the photoconductive receivers are connected directly to the 50 ohm transmission line. In this configuration, it is assumed that these devices present a high impedance and hence do not perturb the signal on the line. If the transmission line were formed on a different substrate to the generator and/or receiver then the proximity of the PCEs to the microstrip would inevitably cause a change in impedance of that line and hence back-reflections would be inevitable. The systems in accordance with embodiments of the present invention minimize such problems.

The terminating resistors may be embedded resistors at the end of the transmission lines (on the microstrip circuit itself), as an alternative to fabricating them on the photoconductive devices.

In a second aspect, the present invention provides a reflectometer for allowing a test of a device, the reflectometer comprising:
 a source of pulsed radiation;
 a first photoconductive element configured to output a pulse in response to irradiation from said pulsed source;
 a second photoconductive element configured to receive a pulse;
 a transmission line arrangement configured to direct the pulse from the first photoconductive element towards the device under test and to direct the pulse reflected from the device under test towards the second photoconductive element, said transmission line having a three terminal arrangement with the first and second elements provided at separate terminals and an input to the device provided at the third terminal.

The DUT can be directly or indirectly connected to the third terminal. For example, the input to the DUT may comprise a further transmission line connected to the DUT.

Direct propagation of an electrical pulse from the generator to the receiver can occur. However, in reflectometers in accordance with embodiments of the present invention, the path length from the generator to receiver is substantially shorter than the path length from the generator to the DUT to the receiver. Therefore, there is no overlap between the two signals in the time domain, so no confusion between outward and reflected signals arises.

In an embodiment, the path length from the generator to the DUT to the receiver is at least twice the path length from the generator to the receiver.

In one embodiment, the three point transmission line arrangement is in the form a Y, known as a Y-splitter design. The design also serves to maintain a certain minimum physical separation between generator and receiver elements sufficient for the aspheric lenses used to focus the pump beam and probe beams onto the active areas of each device. i.e. the device separation must be at least equal to the diameter of the focusing lens.

In a further embodiment, the excitation beam for the generator (pump beam) and the excitation beam for the receiver (probe beam) can be angled inwards to permit a closer device spacing.

Also, devices in accordance with embodiments of the present invention seek to avoid any propagation of the generated or received pulse through the photoconductive semiconductor substrate at all. The signal is directed immediately away from the photoconductor electrode by the bond-wire to the 100Ω microstrip track.

The above transmission line arrangement can be used in combination with the termination resistances.

In a third aspect, the present invention provides a reflectometer for allowing a test of a device, the reflectometer comprising:

a source of pulsed radiation;
a first photoconductive element configured to output a pulse in response to irradiation from said pulsed source;
a second photoconductive element configured to receive a pulse;
a transmission line arrangement configured to direct the pulse from the first photoconductive element to the device under test and to direct the pulse reflected from the device under test to the second photoconductive element,
wherein at least one photoconductive element comprises an pair of electrodes provided on the first surface of a first substrate and said transmission line arrangement is provided on a second surface of a second substrate,
the first and second surfaces being provided facing one another such that there is communication of a pulse between the said element and the transmission line arrangement.

The above arrangement is a flip-chip arrangement where the top face of the photoconductor is placed face down on to the microstrip circuit. Flip chip mounting can also be used to couple the photoconductors to co-planar waveguides, as well as microstrip/stripline waveguides. The electrical connection between the photo-conductive element and the microstrip is formed using one of the normal flip hip methods:

reflow soldering
conductive epoxy

In the case of a reflow solder process, solder paste is deposited onto the contact pads on the microstrip PCB using stencil printing or some other deposition method. The chip is placed face-down onto the PCB such that the paste contacts both the chip and the PCB. The assembly is then heated in an over to melt the solder which forms the join between the two.

The method using conductive epoxy is similar, but lower temperatures can be used for the epoxy to cure.

In order to optically excite the photoconductors in this flip-chip geometry, it is necessary to provide a small hole (for example, using a drill such as a laser-drill) in the PCB to provide optical access to the active region of the photoconductor through the PCB assembly.

An alternative method of providing optical access to the photoconductor is to fabricate the photoconductive layer on a transparent substrate. This is possible using epitaxial liftoff methods to transfer a 1 μm epilayer from a GaAs wafer onto a fused quartz wafer.

In a further embodiment, a reflectometer system is provided comprising a plurality of reflectometers, wherein a single common first substrate is provided for the plurality of reflectometers such that the photoconductive elements for a plurality of reflectometers are flip chip bonded at the same time.

The above provides a multi-channel TDR system where many photoconductive elements are formed on a single semiconductor die and this die is flip-chip mounted to a microware PCB circuit which conveys the pulses to/from the various test-point on the device-under-test (typically a multi-pin IC).

In U.S. Pat. No. 4,896,109, a linear arrangement of photoconductive devices is described located along a single transmission line. A pulse generator is found at one end of the transmission line. The receiver devices are located at measurement points along the transmission line between the generator and the DUT.

The high dielectric constant of semiconductor substrates makes the design of a 100Ω transmission lines difficult. Co-planar designs suffer radiation loss and microstrip design requires very thin track-widths. Coupling a transmission-line on a semiconductor substrate to a co-axial line without generating a large reflection or insertion loss is also difficult.

In an embodiment of the present invention the above problems are at least partially addressed by coupling the photoconductive elements directly to microstrip waveguides formed on low-dielectric-constant (PTFE based) substrates (Taconic TLY5 or Rogers RO4000 are suitable examples of copper clad materials from which high-frequency transmission lines may be fabricated) with no intervening waveguide on the semiconductor. In an embodiment, the dielectric constant $\varepsilon_r$ is 10 or less.

In an embodiment, the path length of the pump beam is varied relative to that of the probe beam or vice versa. Prior art methods for achieving this variation comprise using a stepper-motor actuated optical delay. This approach limits the measurement rate due to the time taken to move the optical delay optics from position to position.

In one embodiment, the system comprises a so-called "fast scanning" system, where the optical delay is obtained by oscillating a glass rhomboid as described in EP 1543372. This permits a high rate of data collection. However, the length of the maximum delay obtainable by using the spinning fast-scanning solution may be insufficient for adequate characterisation of a semiconductor device. Further systems in accordance with embodiments combine a fast-scanning optical delay with a second, long-travel "slow" linear stage-based optical delay. The overall optical delay is then the sum of that from the fast and slow delays. The acquisition method involves collecting one or more fast scanned acquisition waveforms at each value of long delay position. The waveforms from each long-delay position are combined within the controlling PC to generate an overall waveform covering a much longer range than that covered by the fast-scanning delay alone. In this way, optical delays of over 150 mm are obtained. This method is referred to as a "hybrid" scanning method.

U.S. Pat. No. 4,896,109 describes how a DC voltage may be used to bias the pulse-generation device. Optical chopping and phase-sensitive detection has been disclosed in the literature as a means of improving the sensitivity and selectivity (w.r.t. noise) of the signal measurement system. However, optical chopping needlessly reduces the system throughput, since the signal is off for 50% of the time.

In a fourth aspect, the present invention provides reflectometer for allowing a test of a device, the reflectometer comprising:

a source of pulsed radiation;
a first photoconductive element configured to output a pulse in response to irradiation from said pulsed source;
a choke resistor arranged such that said first photoconductive element is biased through said choke resistor, said choke resistor having a resistance of at least 100Ω;
a second photoconductive element configured to receive a pulse;
a transmission line arrangement configured to direct the pulse from the first photoconductive element to the device under test and to direct the pulse reflected from the device under test to the second photoconductive element.

The choke resistor limits the current flow after the optical excitation of the photoconducting gap at the first photoconductive element.

Pure, single-crystal optically active semiconductors typically have a charge-carrier lifetime of over 1 ns (or >1 μs in the case of Si or other materials with an indirect bandgap). This is too long for the measurement or generation of picosecond electrical pulses. It is known to reduce the charge carrier lifetime of such semiconductors by radiation damaging the material, ion-implantation, low-temperature growth or the embedding of other structures such a quantum dots. In this way, carrier lifetimes of under 1 picosecond are possible. However, under the application of a high electric field free charge is less effectively captured by these means. When these low lifetime materials are used to fabricate photoconductive pulse generators, it is found that the resulting pulses are not as short as would be expected from the properties of the un-biased material.

In the above embodiment, a choke resistor is used to limit the current flow in order to allow the generation of sub picosecond pulses. Thus, the need to form a semiconductor substrate with carriers which have inherently low carrier lifetimes is avoided.

The above described terminating resistor or resistors may be used in combination with the choke resistor. The above described transmission line arrangement can be used in combination with the choke resistor and/or termination resistances.

In one embodiment, the choke resistor is integrated directly onto the substrate of the photoconductive device and directly adjacent to a device electrode. In another embodiment, the choke resistor is provided on another substrate and a connection to the photoconductor is made using a bond-wire, surface mount connection etc.

Methods in accordance with embodiments of the present invention employ an AC bias to the pulse generator. It is then possible to use phase-sensitive detection on the signal measured directly from the receiver device. The pump and probe beams remain on continuously, so the throughput is maximised. It should be noted that the laser generates a train of sub-picosecond pulses at a repetition rate of ~80 MHz. This is much faster than the response rate of the electronics or digital sampling system. The 80 MHz is completely smoothed out by the input capacitance of the JFET pre-amplifier. Thus, the beam can be treated as continuous, from the point of view of the acquisition system. When optical chopping is used, the beam is blocked for 50% of the time, during which time the optical power is, in effect, wasted. Using AC bias modulation avoids wasting any optical power.

Receivers of the type used in embodiments of the present invention typically have a rather high source impedance of ~1 Mohm. In embodiments which comprise a pre-amplifier to amplify the output signal of the receiver, the pre-amplifier preferably has a high input impedance to measure this signal source. The input impedance of the pre-amplifier is determined primarily by its input capacitance. Using a JFET buffer, an input capacitance of ~5 pF is provided.

In a further embodiment, for an impedance of 1 Mohm, a bias frequency of $$f = \frac{1}{2piZC} = 31.8 \text{ KHz}$$

Where C=5 pF and Z=1 Mohm.

This allows the optimum bias frequency for the system to be determined. At higher frequencies, the input capacitance of the JFET presents a lower impedance to the source, so reducing the signal amplitude. At lower frequencies, a longer signal integration time is necessary for the phase-sensitive detection, so limiting the measurement rate.

U.S. Pat. No. 4,896,109, FIG. 2, item 33 mentions an inductor which is used as RF-choke. Further, no integration with the photoconductor was described.

In systems in accordance with an embodiment of the present invention, a resistor is used. The resistor may have impedance which is constant with respect to frequency, such that it retains its current blocking action at low frequencies. In an embodiment, the impedance should remain high for frequencies down to (1/recombination time) for charge carriers in the photoconductor. In GaAs, the recombination time is ~1 ns, thus, in an embodiment the choke impedance must remain high for frequencies down to 1 GHz or so. In an embodiment, the impedance is least 100,000 ohm at the AC bias frequency.

In embodiments of the present invention, an optical fibre is used to provide optical excitation to the photoconductive devices. In specific embodiments, single mode fibres are used. The fibres may also be dispersion compensated to nullify the effect of dispersion of the pulse as it passes through the fibres. Polarisation-maintaining fibres may also be used to avoid fluctuations in the signal due to motion of the fibres.

In some embodiments of the present invention the photoconductive devices are coupled to the waveguides using wire-bonding. The bond-wire has an inductance which limits the bandwidth of the signal thus this inductance should preferably be minimised. For this reason, wedge bonding method is preferable over ball bonding. Ribbon bonding is an even more preferable means of minimising the inductance of this connection. Ribbon bonding is preferable to wire-bonding, because ribbon has a lower inductance than wire. Wedge bonding is the normal method of making a ribbon bond (as opposed to ball-bonding, which is generally used with circular cross-section wire).

In an embodiment, the substrate of the photoconductive material is annealed. The substrate may be GaAs, InP, GaInAs or another III-V alloys.

Photoconductive devices generally have a smooth roll-off at their high-frequency limit. This means that although the majority of the generated and detected power lies in the <70 GHz region, there is a small quantity of signal power are frequencies above this. The high dynamic range of the system means that this very high frequency content to the signal may be used to improve the rise time of the system over that obtained using the raw measured pulse.

In an embodiment, optical coupling is made using a collimated free-space beam (i.e. the devices are not coupled to the fibres using a fixed pig-tail arrangement) with two alignment mirrors used to tune the optical alignment onto the devices. This means the device-block (comprising the generator and receiver PCEs, the Y-splitter and the "spark plug" microstrip-to-coax connector) can be easily replaced.

In an embodiment, the current through the generator device as a means of characterising its performance is measured. Should ESD damage to the generator occur, the photocurrent through the generator changes.

In a further embodiment, a test signal is injected into the ground connection to the receiver device which is coupled through to the detection signal when the receiver photoconductor is illuminated by the baser beam. The size of this test-signal provides an indication as to the performance of the receiver device.

Using the above two test methods, it is possible to check for changes in the state of either device due to ESD damage or other degradation.

Systems in accordance with the above embodiments can be adapted for a variety of uses such as:
1. Fault Analysis tool—which probes a single pair of pins on a device. Manual positioning is used.
2. Quality Assurance tool—this is a semi-automated tool for testing a significant sample from a batch of IC substrates.
3. High Volume Manufacture—this is a high-throughput system to test every package before it is integrated with the die.

The highly parallelisable architecture may require planar light circuits (PLC) which distribute the supplied optical power to many pulse generators/receivers. In a further embodiment, a Fault Analysis tool (FA-tool) would be based on a 1.55 um fibre laser. Such a system may further comprise a fibre-based rapid-scan delay line and a "U" bench linear delay, to avoid the need for an optical bench or casting.

In a fifth aspect, the present invention provides a method of performing a reflectometry test on a device, the method comprising:
  providing a source of pulsed radiation;
  providing a first photoconductive element configured to output a pulse in response to irradiation from said pulsed source;
  providing a choke resistor arranged such that said first photoconductive element is biased through said choke resistor, said choke resistor having a resistance of at least 100Ω;
  providing a second photoconductive element configured to receive a pulse;
  directing the pulse from the first photoconductive element to a device under test and directing the pulse reflected from the device under test to the second photoconductive element.

In a sixth aspect, the present invention provides a method of performing a reflectometry test on a device, the method comprising:
  providing a source of pulsed radiation;
  providing a first photoconductive element configured to output a pulse in response to irradiation from said pulsed source;
  providing a second photoconductive element configured to receive a pulse;
  directing the pulse from the first photoconductive element to a device under test and directing the pulse reflected from the device under test to the second photoconductive element using a transmission line; and
  providing a termination resistance provided for said transmission line configured to match the impedance of the transmission line.

In a seventh aspect, the present invention provides a method of performing a reflectometry test on a device, the method comprising:
  providing a source of pulsed radiation;
  providing a first photoconductive element configured to output a pulse in response to irradiation from said pulsed source;
  providing a second photoconductive element configured to receive a pulse;
  directing a pulse from the first photoconductive element to a device under test and directing a pulse reflected from the device under test to the second photoconductive element using a transmission line, said transmission line having a three terminal arrangement with the first and second elements provided at separate terminals and an input to the device provided at the third terminal.

In an eighth aspect, the present invention provides a method of performing a reflectometry test on a device, the method comprising:
  providing a source of pulsed radiation;
  providing a first photoconductive element configured to output a pulse in response to irradiation from said pulsed source;
  providing a second photoconductive element configured to receive a pulse;
  directing the pulse from the first photoconductive element to a device under test and directing the pulse reflected from the device under test to the second photoconductive element using a transmission line,
  wherein at least one photoconductive element comprises an pair of electrodes provided on the first surface of a first substrate and said transmission line arrangement is provided on a second surface of a second substrate,
  the first and second surfaces being provided facing one another such that there is communication of a pulse between the said element and the transmission line arrangement.

BRIEF DESCRIPTION OF THE DRAWINGS

The present invention will now be described with reference to the following non-limiting embodiments in which.

FIG. 17b is a detailed view of the photoconductive emitter of the system of FIG. 17a and FIG. 17c is a detailed view of the photoconductive detector of the system of FIG. 17a;

FIG. 18a is a schematic of a wye splitter which may be used in the system of FIG. 17a and FIG. 18b is a schematic of a delta splitter which may be used in the system of FIG. 17a;

FIG. 19 is a schematic of the microstrip substrate and microstrips of FIG. 17a;

DETAILED DESCRIPTION OF THE PREFERRED EMBODIMENTS

Figure 1:
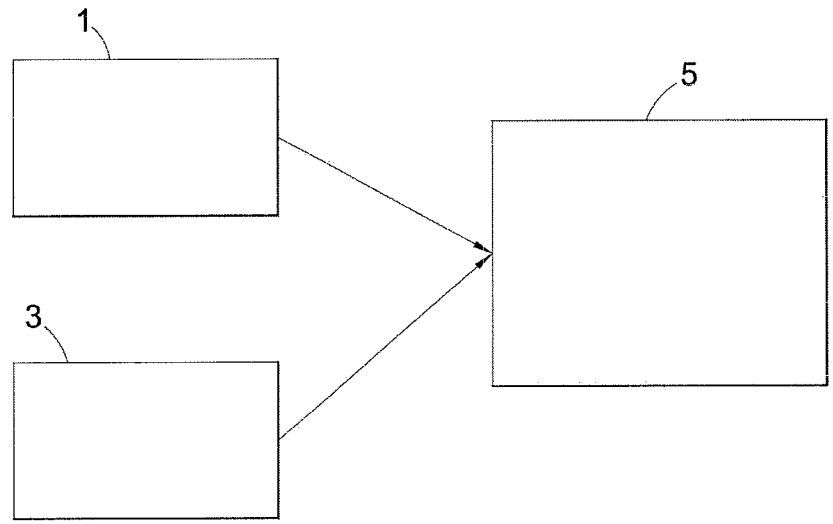
FIG. 1 is a schematic of a reflectometer.

FIG. 1 is a schematic of a test apparatus in accordance with an embodiment of the present invention. A photoconductive element 1 sends a pulse along a transmission line to Device Under Test (DUT) 5. In an embodiment the pulses outputted by the first photoconductive element are in the frequency range from 10 GHz to 10 THz. In a further embodiment, the frequency range is from 50 GHz to 500 GHz.

The DUT reflects the signal back along transmission line to photoconductive receiver 3. By measuring the reflected pulse, it is possible to determine if there are any problems with the DUT. The pulse will be reflected if there is some defect such as a short or an open circuit. Generally, the DUT will comprise many contacts which will need to be tested. The photoconducting element which is used as the generator 1 and the photoconducting element which is used as the receiver 3 will be positioned accordingly.

Figure 2:
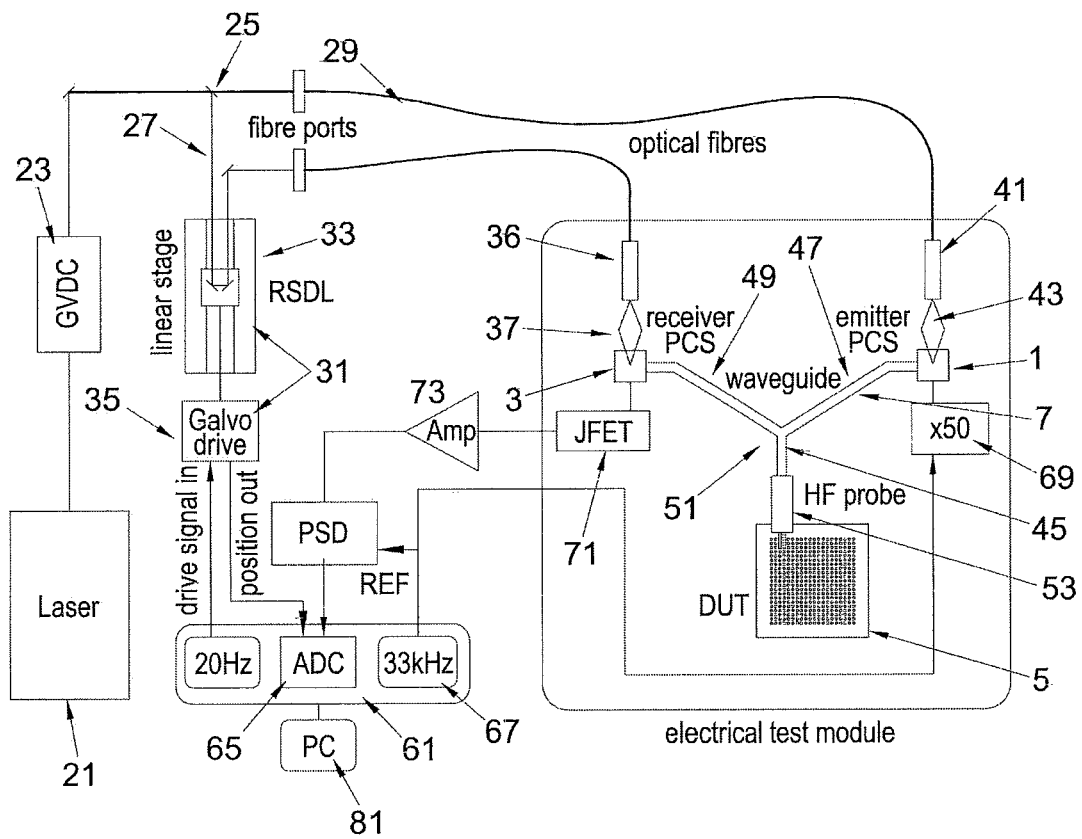
FIG. 2 is a detailed schematic of a reflectometer in accordance with an embodiment of the present invention.

FIG. 2 shows a test system in accordance with an embodiment of the invention. To avoid any unnecessary repetition, like reference numerals will be used to denote like features. Photoconductive element 1 directs radiation into transmission line assembly 7 and radiation is reflected from DUT 5 back through transmission line assembly 7 to the photoconductive receiver 3.

The system comprises a laser. In this specific embodiment, it is a mode-locked sub-picosecond laser system which operates around 800 nm wavelength. The output of the laser 21 is then directed into group velocity dispersion compensator (GVDC) unit 23. GVDC unit 23 is used to chirp the pulse emitted by laser 21. The pulse will be passed through optical fibres. It is possible the pulse will be stretched as it passes through the optical fibres and therefore unit 23 is there to compress the pulse to compensate for any distortion caused in the fibres.

The pulse is then split via beamsplitter 25 into a probe pulse which follows path 27 and a pump pulse which follows path 29. The pump pulse is used to excite the generator and the probe pulse is used to excite the receiver. To sample a range of frequencies of the pulse, it is necessary to vary the optical delay between the pump and probe pulses. This is performed by using a rapid scanning optical delay line 31. The delay line 31 can be provided in either the path of the pump pulse or the probe pulse. In this particular embodiment, it is provided within the path of the probe pulse 27. The delay line 31 has two paths a linear stage slow scanning part 33 and a galvanometer driven part which is described in EP 1543372.

The combination of the slow scanning part and the galvanometer 35 driven part permits a high rate of data collection while allowing the delay to be scanned over a long length. The acquisition method involves collecting one or more fast scanned acquisition waveforms at each value of long delay position. The waveforms from each long-delay position are combined within a controlling PC to generate an overall waveform covering a much longer range than that covered by the fast-scanning delay alone. In this way, optical delays of over 150 mm are obtained.

Once the probe beam has passed through delay 31, the probe is coupled into a single mode polarisation maintaining optical fibre which conveys the beam to the receiver 3. The pump beam is also coupled into a single mode polarisation maintaining optical fibre and directed towards the generator.

On the output of the optical fibre which carries the probe pulse is collimator 36 which couples the near infra-red beam output of the optical fibre into a collimated beam. This is then output to lens 37 which directs the near infra-red radiation onto photoconductive receiver 3. Photoconductive receiver 3 comprises a JFET buffer transistor 71 which receives the output signal of the receiver 3. The output signal is then passed through pre-amp 73.

Photoconductive receiver 3 will generally have a rather high source impedance of ~1 Mohm. Pre-amp 73 is used to amplify the output signal of the receiver 3. The pre-amplifier 73 preferably has a high input impedance to measure this signal source. The input impedance of the pre-amplifier 73 is determined primarily by its input capacitance. Using JFET buffer 71, an input capacitance of ~5 pF is provided.

The pump pulse is directed into a collimator 41 which couples the near infra-red pump beam output of the fibres into a collimated beam. This beam is then focused by lens 43 onto generator 1.

Figure 3:
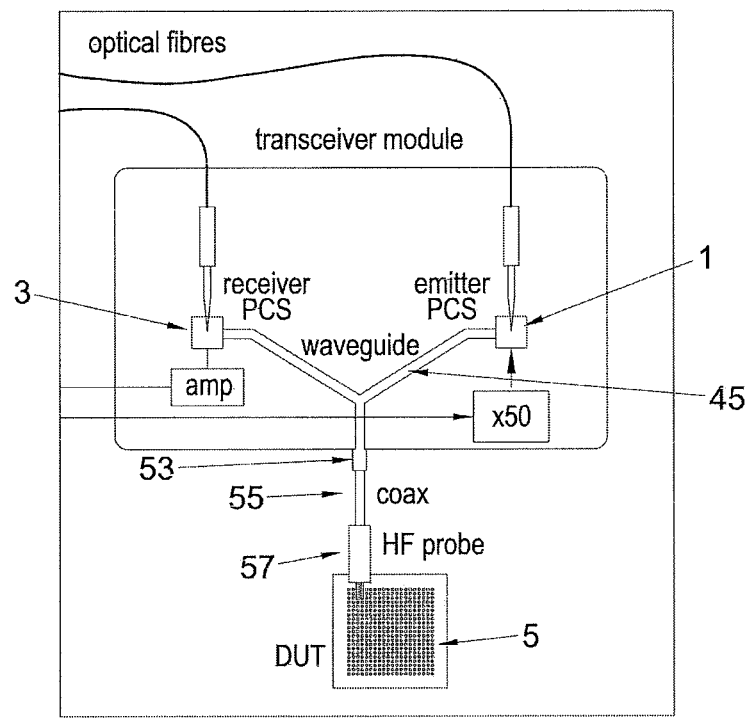
FIG. 3 is a further detailed schematic of a reflectometer in accordance with an embodiment of the present invention showing the probe of the reflectometer of FIG. 2.

Both the receiver 3 and the generator 1 are coupled to a transmission line which in this embodiment is microstrip waveguide Y-junction 45. Microstrip waveguide Y-junction comprises a first arm 47 which is a 100Ω microstrip transmission line waveguide connected to the generator 1. A second arm 49, which is also a 100Ω microstrip transmission line waveguide, is connected to the receiver 3. The first 47 and second arms of the transmission line waveguide join to form third arm 51 which is a 50Ω microstrip transmission line waveguide. The third arm 51 is then connected to an interconnect 53 which joins the third arm 51 of the microstrip waveguide to a coaxial cable waveguide. This is shown in more detail in FIG. 3.

In one embodiment, to allow more time for multiple reflections between the generator and receiver to decay, the path via the DUT should be twice the length of the direct generator-receiver path. For example, in the above described system. As an example, the direct path from the generator to receiver is 8 mm, while the path via the DUT is ~170 mm.

Figure 3A:
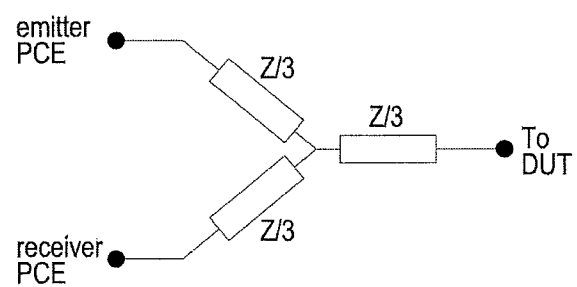
FIG. 3a is a schematic of a variation of the microstrip transmission line used in the reflectometer of FIGS. 2 and 3.

The microstrip waveguide Y junction 45 may be more "V" shaped with a small central arm. For example, the 50-ohm leg of the line is a very short stub, connecting directly to the interconnect. In a further embodiment, it is possible to implement at broadband 50-ohm 3-port splitter using a thin film resistor network to match the impedances as shown in FIG. 3a: Each port presents a 50-ohm load, provided 16.7 ohm resistors are inserted at the junction as shown. This is known as a 6 dB resistive splitter. It has a broadband frequency characteristic (i.e. it's efficiency and splitter ratio is independent of frequency). Since the TDR signal must make two transitions across this device, the total loss due to the splitter will be 12 dB. By contrast, the asymmetric splitter used in this embodiment case (2×100 ohm ports, 1×50 ohm port) has only 3 dB loss with each pass through it (i.e. 6 dB in total). Thus, the throughput power can be improved by a factor of 4 compared to the more conventional symmetric design.

The coaxial connector 53 is then connected to coaxial waveguide 55. The coaxial waveguide 55 is a 50Ω waveguide. This is connected to a high frequency probe 57 which is coaxial probing tip, for example a GGB picoprobe model 110H. The probing tip 57 can be moved to various ports on the device under test 5.

The control electronics are shown as section 60 in FIG. 2. A 20 Hz oscillator provides the drive signal to the delay line 31. The position of the delay line is then fed into analogue to digital converter 65. A 33 kilohertz oscillator 67 is provided to output an AC signal to generator 1. Generator 1 in its simplest form comprises a photoconductive substrate with a pair of electrodes. The electrodes are arranged such that there is a photoconducting gap between the two electrodes. By applying an AC bias across the electrodes, upon illumination via a near infra-red (NIR) pulsed beam of radiation, a picosecond pulse is generated by the generator 1. A transformer 69 is provided which steps up the output from the oscillator 67 to the generator 1.

The receiver is of a similar configuration to the generator, but here, the receipt of both the NIR probe pulse and the pulse reflected from the DUT will cause bias to flow between the electrodes. This is passed first through JFET 71, through amplifier 73, through Phase sensitive detection (PSD) through analogue digital converter 65 to the PC 81. In the above described embodiment, phase sensitive detection is performed within the system PC after digitisation. However, other techniques such as the use of a lock-in amplifier could be employed.

Figure 4:
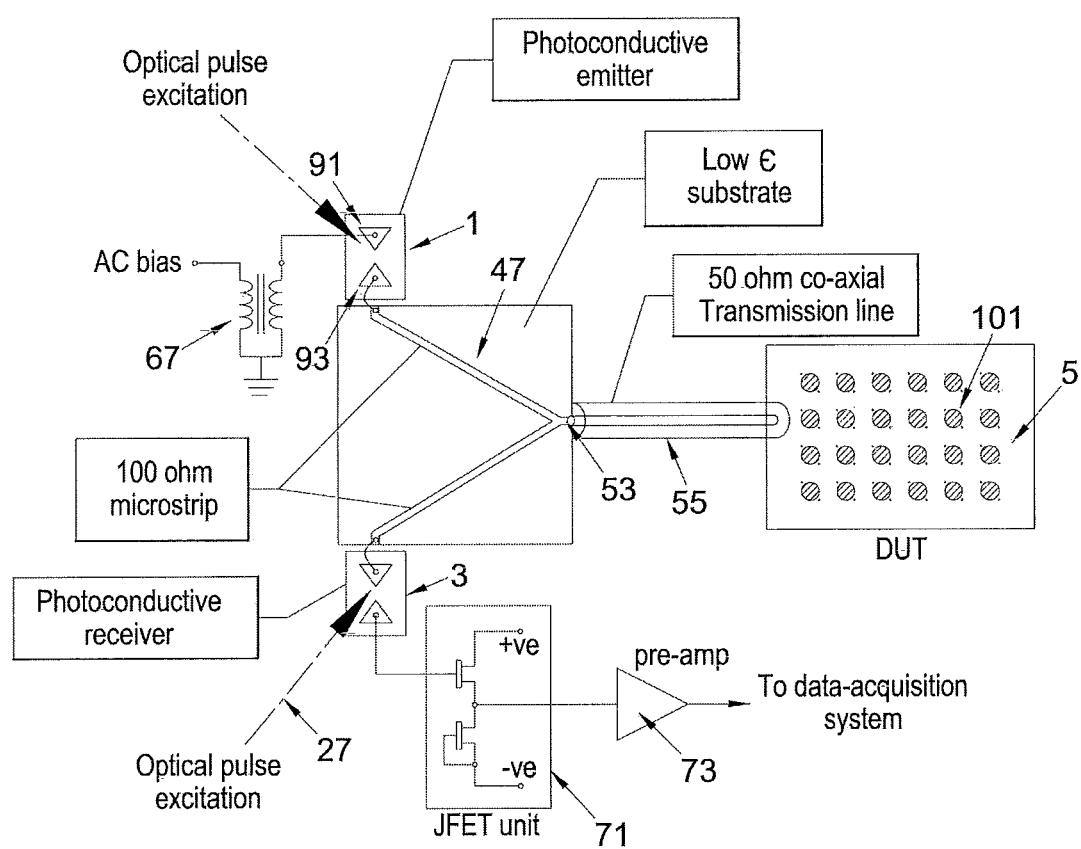
FIG. 4 is a schematic of a reflectometer in accordance with an embodiment of the present invention showing the photoconductive elements provided on a different substrate to the transmission lines.

FIG. 4 shows a testing module in accordance with an embodiment of the present invention in more detail. To avoid any unnecessary repetition, like reference numerals will be used to denote like features. An AC bias from oscillator 67 is applied across the electrodes 91 and 93 of generator 1. This then passes a generated signal along first 100Ω transmission line 47. The microstrip waveguide 47 is formed on a different substrate to that of the photoconductive elements.

The high dielectric constant of semiconductor substrates makes the design of 100Ω transmission lines difficult. Thus, in this embodiment, the microstrip waveguide 47 is formed on low-dielectric-constant substrate such as a PTFE based substrates e.g. Taconic TLY5 or Rogers RO4000.

This signal is then passed into 50Ω transmission line which is then converted via coax converter 53 into coax transmission line 55. The signal is then directed into ports of the DUT 5. The signal reflected from DUT then passes back along coaxial transmission line 55, through the third arm (not shown) of the transmission line 53 and along the second arm 49 of the transmission line. The output is then directed onto photoconductive receiver 3. This is then passed through JFET 71. The optical excitation is the probe pulse 27 which is an NIR pulse, the combination of the optical excitation 27 and the signal reflected from the DUT 5 will cause a bias to flow across the electrodes. The output is then amplified using amplifier 73 and the output is processed with data acquisition system.

Figure 5:
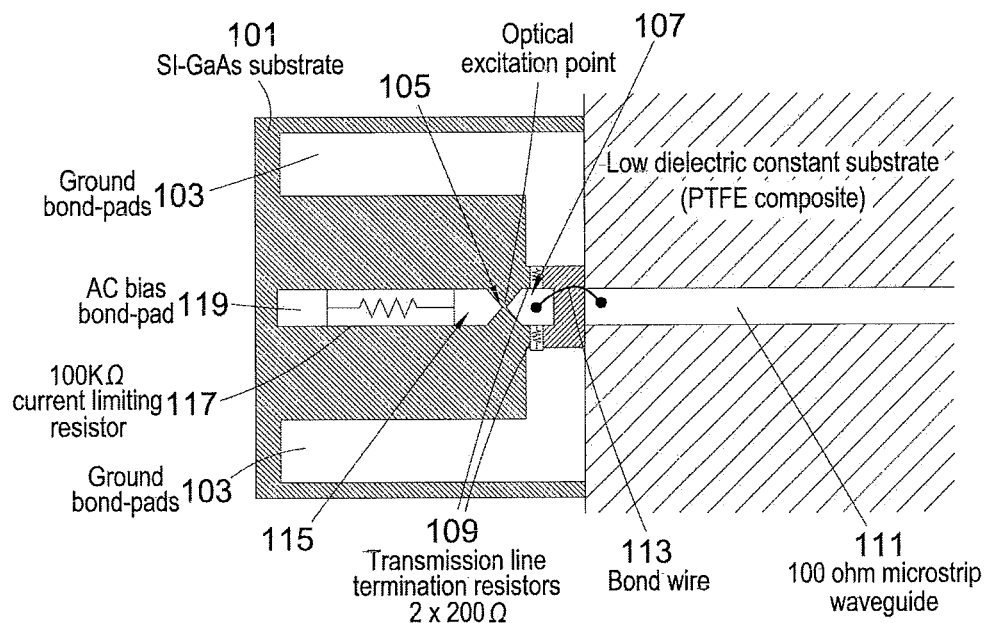
FIG. 5 is a schematic of a photoconductive element and transmission line for use in a reflectometer in accordance with an embodiment of the present invention.

FIG. 5 shows a photoconductive element in accordance with an embodiment of the present invention in more detail. The element is formed on a photoconductive substrate 101. In this particular example, it is semi-insulating gallium arsenide, but it can be any photoconducting substrate. Ground bond pads are provided overlying the substrate. In this particular example, they are in the form of a square U with a gap in the base of the U. The shape could also be thought of as being an L-shaped bond pad with a mirror image of an L-shaped bond pad provided closely spaced from the first L-shaped bond pad. The bond pads will typically be gold but may also be aluminium or any other known bond pad material.

A gap 105 is provided at the bottom of the U-shaped bond pads 103. In this gap a first electrode 107 of the photoconductive element is provided. The first electrode 107 is connected to both sides of the bond pad 103 via transmission line termination resistors. In this particular embodiment, each transmission line termination resistor is approximately 200Ω. The terminating resistors are provided to match the impedance of the transmission lines to avoid back-reflections causing artefacts in the output signal. The two 200 ohm resistors act in parallel to present a 100 ohm load which matches the 100 ohm impedance of the microstrip transmission line.

The first electrode 107 is connected to 100Ω microstrip waveguide 111 via bond wire 113. Second photoconductive element electrode 115 is provided opposite first photoconductive electrode 107. The first photoconductive electrode 107 and second photoconductive electrode 115 are configured to have a small gap between their apexes formed by photoconducting substrate 101. Second photoconducting electrodes 115 is provided in series with a 100 KΩ current limiting (choke) resistor 117 and an AC bond pad 119 is connected to the current limiting resistor 117. The choke resistor 117 is used to limit the current flow in order to allow the generation of sub picosecond pulses.

The second photoconducting electrode 115, the resistor 117 and the bond pad 119 are provided in a line within the cavity of the U-shape formed by the bond pads 103.

When configured as a generator, an AC bias is applied to bond pad 109 and bond pads 103 are grounded, this therefore applies AC bias across photoconducting gap between the first 107 and second photoconducting electrodes. Application of a pulse of NIR radiation across the photoconducting gap results in the output of a signal which is passed from first electrode 107 into 100Ω microstrip waveguide 111 via bond wire 113.

The bond-wire has an inductance which limits the bandwidth of the signal thus this inductance should preferably be minimised. For this reason, a wedge bonding method is preferable over ball bonding. In an embodiment, the wire impedance is 100 ohm or less at the maximum frequency of interest. For example, at a max frequency of 100 GHz this corresponds to 160 pH. At 1 THz, this would be 16 pH. Note, theoretically, a 200 µm long wire with diameter 25 µm (typical for a bond wire) would have an inductance of ~100 pH.

In order to configure the PCE as a receiver, the 100Ω microstrip waveguide 111 receives the pulse which has reflected from the DUT and this is transmitted through bond wire 113 to first electrode 107. When an NIR excitation signal (the probe pulse) is applied across photoconducting gap 106, an AC bias flows between the first 107 and second 115 electrodes and this is then detected.

Figure 6:
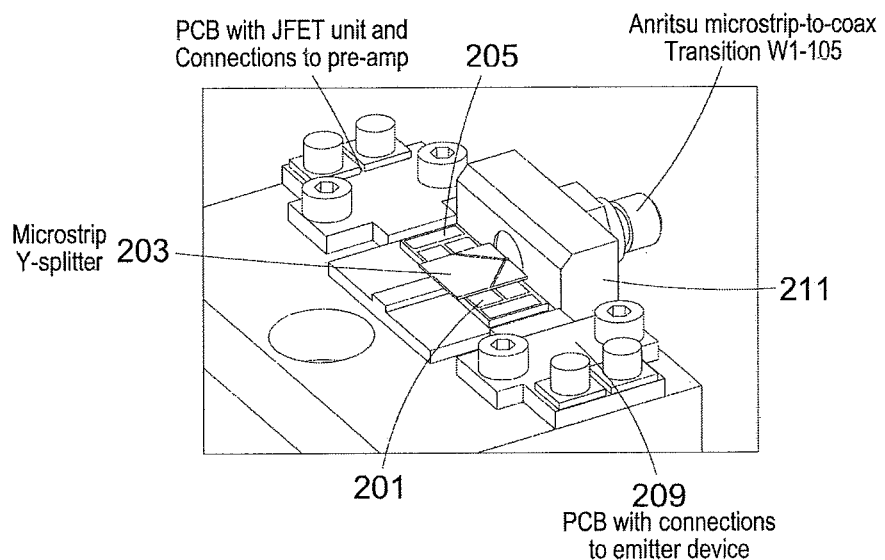
FIG. 6 is a 3D schematic of a reflectometer in accordance with an embodiment of the present invention.

FIG. 6 shows the test structure can be used in accordance with an embodiment. A photoconductive generator 201 is provided and coupled to a microstrip Y-splitter 203. The photoconductive generator 201, which may be of the same type as described with reference to FIG. 5, outputs the pulse into a terminal of microstrip line 203 as described with reference to FIG. 5. A receiver 205 is then provided to detect the reflected pulse. In the embodiment shown in FIG. 6, the arrangement of the ground bond pads 103 is different to that shown in FIG. 5. However, the same configuration remains of two electrodes provided across a photoconducting gap and the ability to apply an AC bias across the gap and the ability to couple one of the electrodes directly to the arms of microstrip Y-splitter 203.

A PCB 209 is provided with connections to the generator device adjacent to the generator device and a PCB comprising a JFET unit and preamp is provided adjacent the receiver device. The transmission line unit is provided between the generator and receiver photoconducting elements. The output from the transmission line is then provided through a microstrip to coax converter 211.

Figure 7:
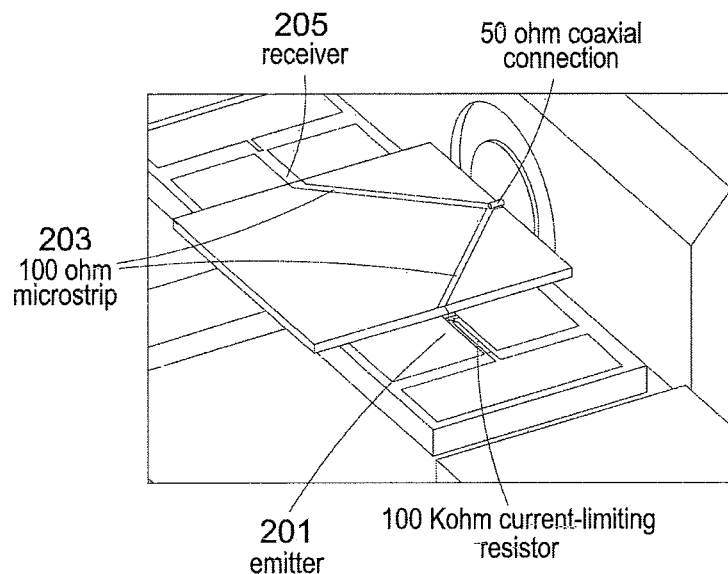
FIG. 7 shows an enlarged section of the schematic of FIG. 6.

FIG. 7 shows an enlarged view of the transmission line and first and second elements of FIG. 6. To avoid any unnecessary repetition, like reference numerals will be used to denote like features.

Figure 8:
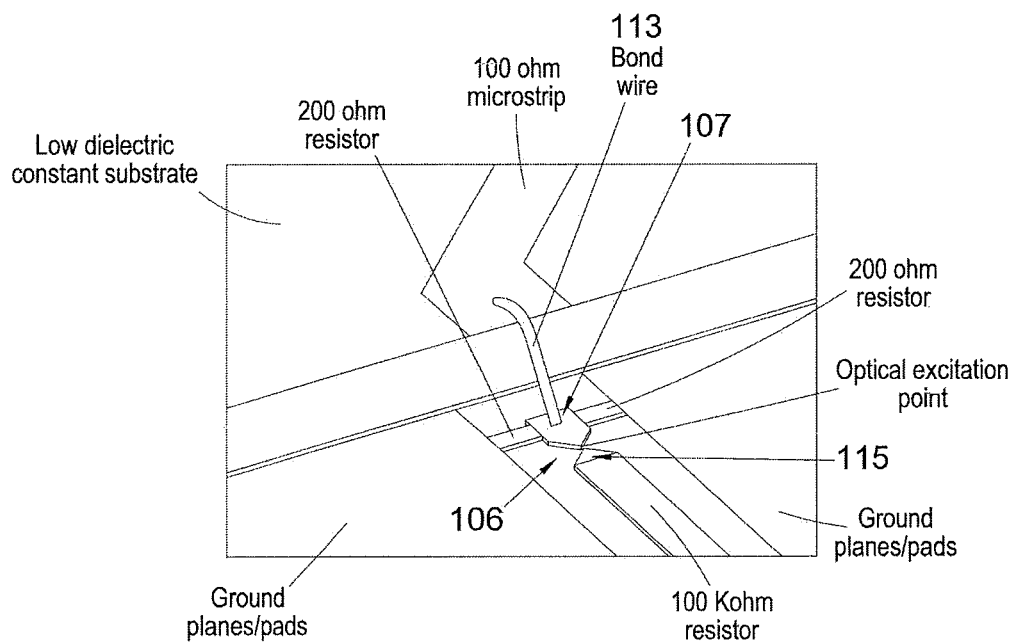
FIG. 8 is a schematic showing a bonding connection between a microstrip and photoconductive element.

FIG. 8 shows the connection between the photoconductive generator first element 107 and the 100Ω microstrip line 111. The first electrode 107 and second electrode 115 form a photoconductive gap 106 between the apexes of the two electrodes. The bond wire 113 carries the signal from the first electrode 107 to the microstrip waveguide 111.

In the above embodiments, two photoconductive devices are coupled to microstrip waveguide Y-junction. The Y-junction has 3 ports, two 100Ω ports which the photoconductors are coupled to and a 50Ω port which connects to a 50Ω coaxial cable.

The pulse propagating along the microstrip from either of the 100Ω ports will generate a partial reflection at the 50Ω port due to the impedance mismatch. However, the photoconductive devices include matching resistors which terminate the microstrip with a 100Ω impedance which absorbs any back signal reflected back to the devices.

Signals reflected back from the DUT to the 50Ω port do not generate any reflection at that port since the two 100Ω microstrips combine to present a 50Ω load to the coax line. The signals are divided equally between the microstrip and the generator and to the receiver respectively where they are absorbed by the matching resistors on the devices.

In addition or as an alternative to the terminating resistors, a choke resistor is provided. The choke resistor limits the current which is applied through the electrode.

In a further embodiment, the test assembly has a transceiver. In this arrangement, the photoconductive generator and the photoconductive receiver are integrated onto a single semiconductor substrate and linked by a 50Ω microstrip transmission line.

In this arrangement, a transmission line arrangement 201 is provided with the DUT 203 provided at the end of the transmission line arrangement 201. The transmission line is drawn as two wires upper one signal, lower one is the current ground return. In the Y or V shaped transmission lines, the ground return is carried on the ground plane which lies unseen under the rest of the circuitry.

The generator 205 is provided at the end of the microstrip line 201, the opposing end to the DUT 203. The generator is AC biased 207 through choke resistor 209. In this particular embodiment, the choke resistor is a 100 KΩ choke resistor.

Additionally, the microstrip is terminated with a 50Ω matching resistor 211. This absorbs signals incident on the generator from further along the transmission line, for example back reflections.

The receiver 213 is formed at a gap directly between the microstrip and receiver electrode. As before, the receiver also comprises a JFET buffer and the signal is output to a pre-amplification digitization and acquisition system.

In the above embodiment, an AC bias is used to bias the devices. This allows phase sensitive detection to be used in the signal processing. However, it is also possible to use a DC bias. Furthermore, the position of the generator and receiver devices may be swapped such that the receiver device is located at the end of the transmission line 201 and the generator abuts the 50Ω strip line.

In an embodiment, the microstrip 201 is not connected directly to the DUT 203. In an embodiment, a transition to a coaxial transmission line can be made. The coaxial line may then be used to convey the signal to/from the DUT. In order to realise a higher bandwidth transition to a coaxial transmission line geometry, a thinned semiconductor substrate may be used to better match the dielectric co-diameter of a standard coaxial connector. In one embodiment, the semiconductor substrate has a thickness in the range from 100 um to 300 um, in a further embodiment, the substrate is approximately 200 microns thick.

Figure 9:
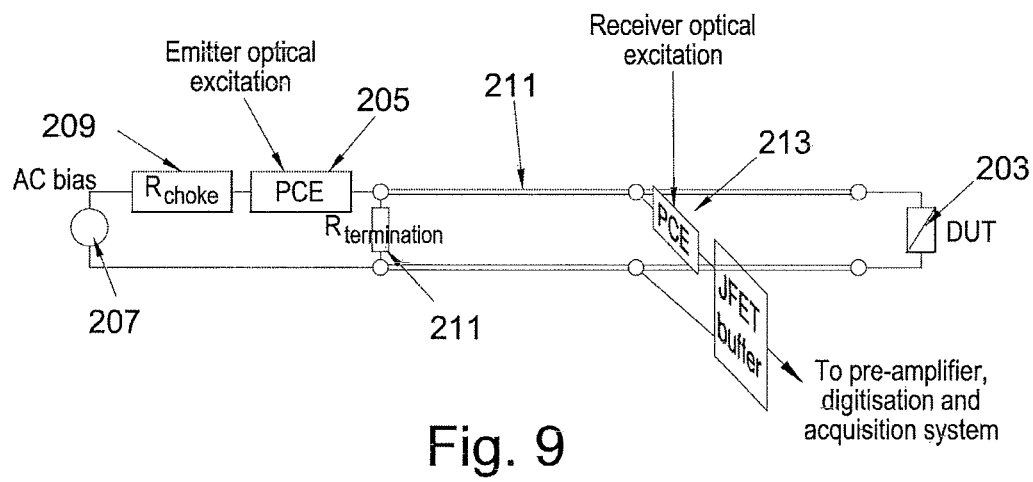
FIG. 9 is a line drawing of a reflectometer with a transceiver configuration in accordance with an embodiment of the present invention.
Figure 10:
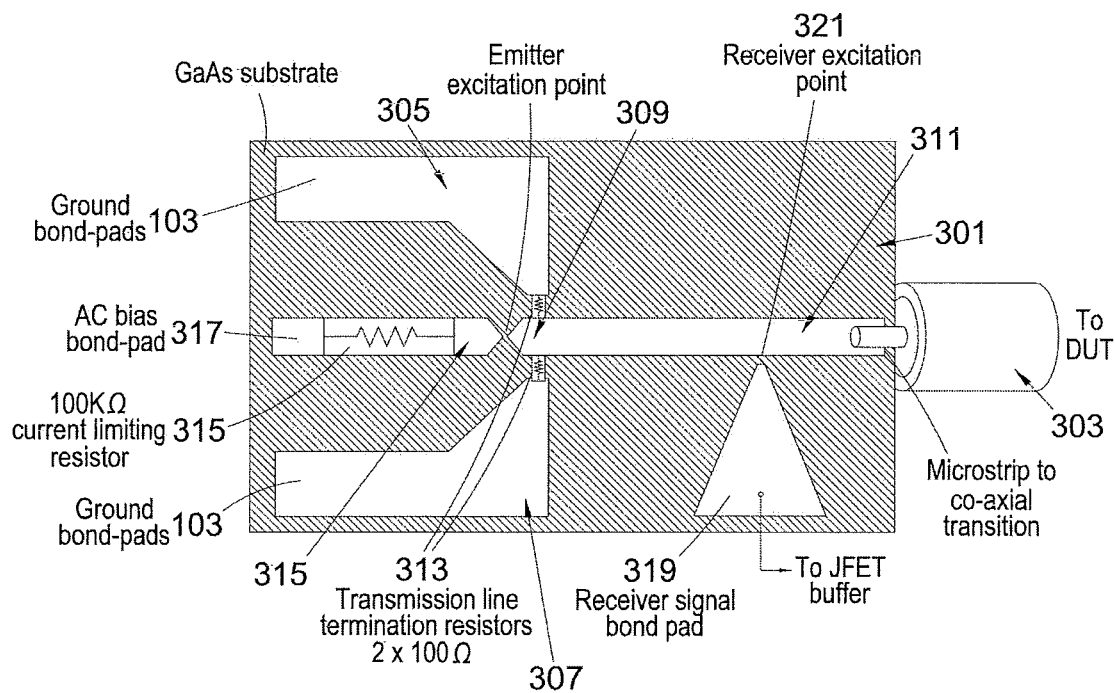
FIG. 10 is a schematic drawing of a reflectometer with a transceiver configuration in accordance with an embodiment of the present invention.

FIG. 10 shows a photoconductive transceiver element as described with reference to FIG. 9. The transceiver element is formed on a semiconductor substrate 301. The semiconductor substrate 301 has a thickness between 100 microns and 300 microns and preferably around 200 microns so that it is roughly the same width as that of a standard coax connector.

On one end of the substrate a microstrip to coaxial transition element 303 is provided. This then carries the signal to the DUT (not shown). Two bond pad elements 305 and 307 provide the ground bond pad elements. These elements together form a U-shape with a gap in the space of the U. Through this gap is provided a first electrode 309 which is connected to transmission line 311. Transmission line 311 then extends towards transition element 303. The first electrode 309 is connected to the two bond pad elements via transmission line termination resistors 313. Both of the termination resistors 313 are 100Ω, such that when they act in parallel, they present the required 50 ohm load to match the resistance of the transmission line.

Opposite the first electrode 309 is a second electrode 315. Both first and second electrodes are configured to have an apex and the two apexes are arranged to face each other with a small gap, the photoconducting gap therebetween. The second resistor 315 is biased via AC biased bond pad 317 and through choke resistor 315. Choke resistor 315 in this embodiment is 100 kΩ.

In this particular embodiment, the arrangement of the first electrode and the second electrode form the generator photoconducting element.

The receiver photoconducting element is provided by a receiver electrode 319 which is provided at a point along the transmission line 311. The output from the receiver electrode is then processed in the same way as for a receiver when provided separately to the generator.

In order to emit and detect sub-picosecond pulses, the transceiver needs to be irradiated by a pump pulse and a probe pulse. The generator excitation point which receives the pump pulses between the two apexes at the first 309 and second 315 electrodes. The second excitation point 321 is between the receiver electrode 319 and the transmission line 311. This is the excitation point which receives the probe pulse.

In a further embodiment, the receiver photoconductive element can be located at the termination of the line at the generator further towards the DUT along the transmission line. The relative positioning of the generator and receiver photoconductive elements is not important.

However, it should be noted that in the above embodiment, the transmission line is resistively terminated such that back reflections from the end of the line are minimized.

The generator and receiver are spatially separated in order to ensure that no optical cross talk occurs between the two photoconductive elements. The generator is biased through a high resistance current choke and the receiver should drive a very high input impedance amplifier such as that provided by a JFET buffer.

Figure 11:
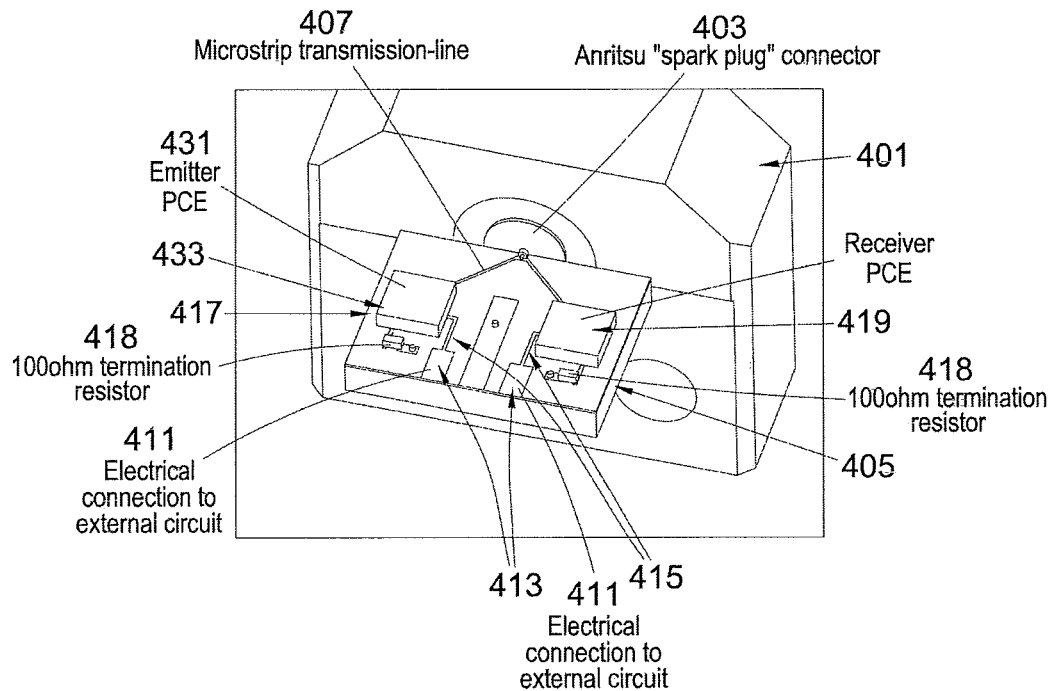
FIG. 11 is a schematic of a reflectometer in accordance with an embodiment of the present invention where the photoconductive elements have been bonded to the transmission line using a flip-chip technique.

FIG. 11 shows a further apparatus in accordance with an embodiment of the present invention. Here, the receiver and generator photoconductive elements are provided in a separate element which is then flip chip mounted to the transmission lines. This avoids the need for bond wires.

In the arrangement of FIG. 11, unit 401 is for mounting and comprises a spark plug connector 403 which connects the transmission line to the coaxial line for transmitting the signal to the device under test (not shown). The device assembly has a Y-shaped microstrip transmission line 407 of the type previously described. This transmission line is formed on a substrate 405. Two electrical connections 411 are also provided on substrate 405. These terminals consist of bond pads 413 and tracks 415 which either lead to first area 417 or second area 419. Termination resistors 418 are provided on first substrate 405. Each of these resistors bridge between a contact point and an end arm of said Y-shaped microstrip transmission line 407. One branch of microstrip transmission line 407 runs through first area 417 and the other branch through second area 419. In this embodiment, the generator photoconductive element 431 is provided in the first area 417 and the receiver photoconductive element 433 in the second area.

Figure 12:
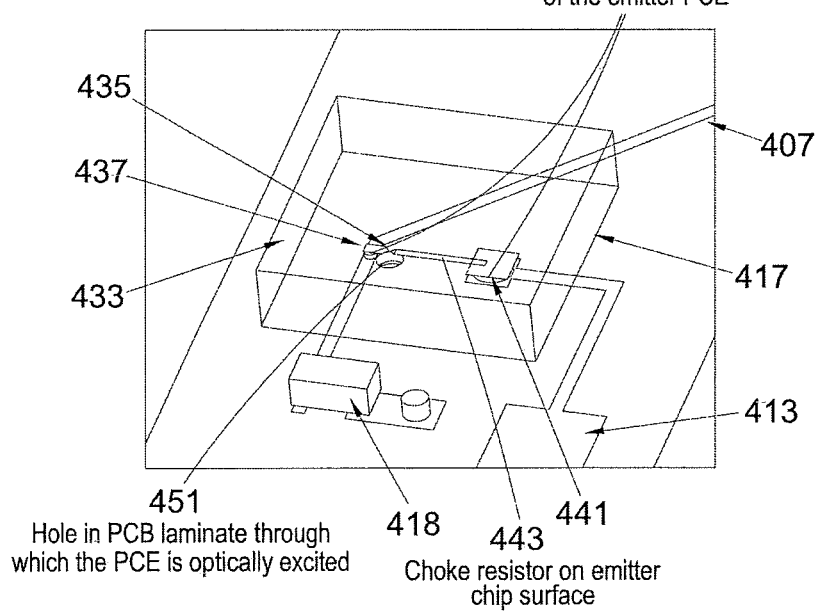
FIG. 12 is a schematic of the reflectometer of FIG. 11 with a transparent photoconductive generator to illustrate the metal tracks underneath the photoconductive generator.

The generator 431 is formed on generator substrate 433. The photoconductive element is formed on a first surface of generator substrate 433. The generator substrate is then turned upside down and bonded to the top of the first area 417. FIG. 12 shows the structure in more detail. To avoid any unnecessary repetition, like reference numerals will be used to denote like features. The generator substrate 433 is shown as wireframe in FIG. 12 so that the structure on the surface of the generator substrate can be seen. Here, the structure comprises a large pad 441 which is connected through choke resistor 443 to a first electrode 435. A large second electrode 437 is then provided facing the first electrode 435. Both the first and second electrodes comprise apexes which face each other. When the structure is inverted, conductive epoxy is applied to both bond pad 441 and the larger second electrode 437. The larger second electrode 437 should be large enough to allow epoxy to be applied to it. The structure is then inverted and the bond pad 441 is placed in the first area above track 415 of electrical connection 413 and the second electrode 437 is provided so that when the structure is inverted, it is bonded by epoxy to transmit line 407.

A hole 451 is formed through the first area 417 of the first substrate (see FIG. 12). This hole is positioned so that the pump pulse can be used to excite the photoconductive gap between the first 435 and second 437 electrodes.

Figure 13:
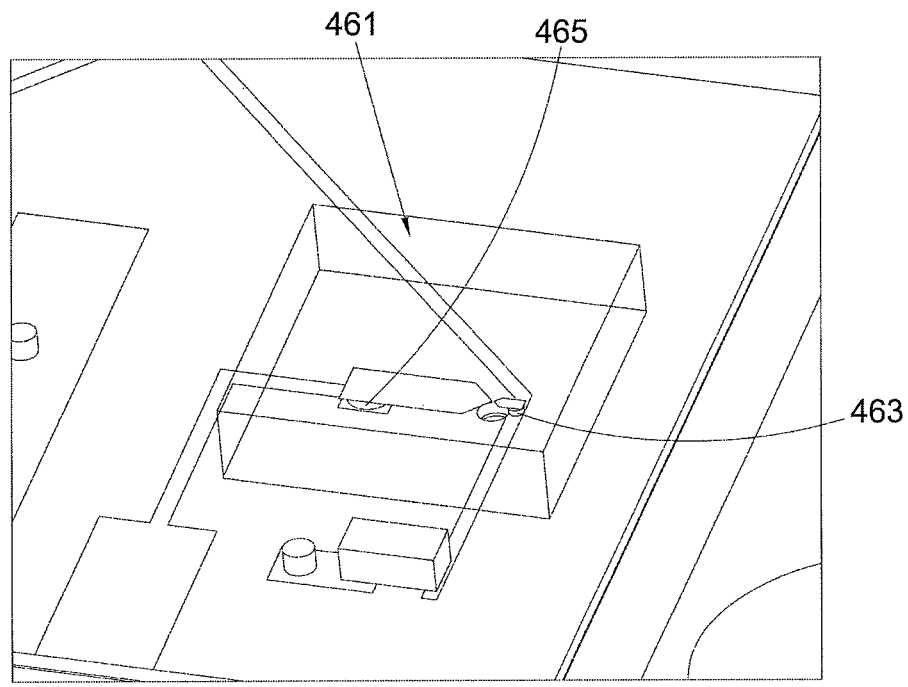
FIG. 13 is a schematic of the reflectometer of FIG. 11 with a transparent photoconductive receiver to illustrate the wiring underneath the photoconductive receiver.

FIG. 13 shows the receiver 433. Again, the receiver is formed on one surface of a receiver substrate 461. A first electrode 463 is provided on the surface of the receiver substrate 461 and a second electrode 465 is provided on the surface of the receiver substrate 461. The first electrode 463 and the second electrode 465 together form photoconducting gap.

When the receiver substrate is turned over, the first electrode is configured to align with the transmission line 407 and is bonded to the transmission line 407 and the second electrode 465 is configured to align with a bond pad extending from track 415 of electrical terminal 413. A hole is provided through the substrate such that the photoconductive gap between the first 463 and second 465 electrodes can be illuminated with the probe pulse.

In the above embodiment, the photoconductive elements are mounted directly onto a transmission line circuit formed on the first substrate (i.e. a strip line, microstrip or co-planar waveguide structure). In the design of the above embodiment, the substrate of the photoconductive element is not used to convey pulses in the device but instead a separate PCB circuit on the first substrate is used.

In this embodiment, small regions of conductive epoxy is used to form the electrical connection between the generator element 431 and receiver 433 and the microstrip circuit. Typically, during fabrication, the microstrip circuit will be deposited using a stencil printing process. In a further embodiment, a solder-paste may be deposited in the electrical connection formed using a reflow process. Such a reflow process comprises heating the assembly to melt the paste and solidify it as it cools.

A gap 50 of approximately 50 microns will remain between the first surface and the surfaces of the generator 431 and receiver 433. This gap is small enough such that propagation of the pulse across the epoxy bridge between the generator/receiver and microstrip is unimpeded while it is large enough that the presence of the generator substrate does not perturb the propagation of the pulse along the microstrip circuit or cause reflections at the edge of the substrate used for both the receiver and generator.

In the design of this embodiment, the 100Ω termination resistor is also implemented as a flip chip bond device or surface mount device. Alternately, the termination resistor may be fabricated directly onto the microstrip circuit using thin-film processing methods or evaporated onto the substrate.

Figure 14:
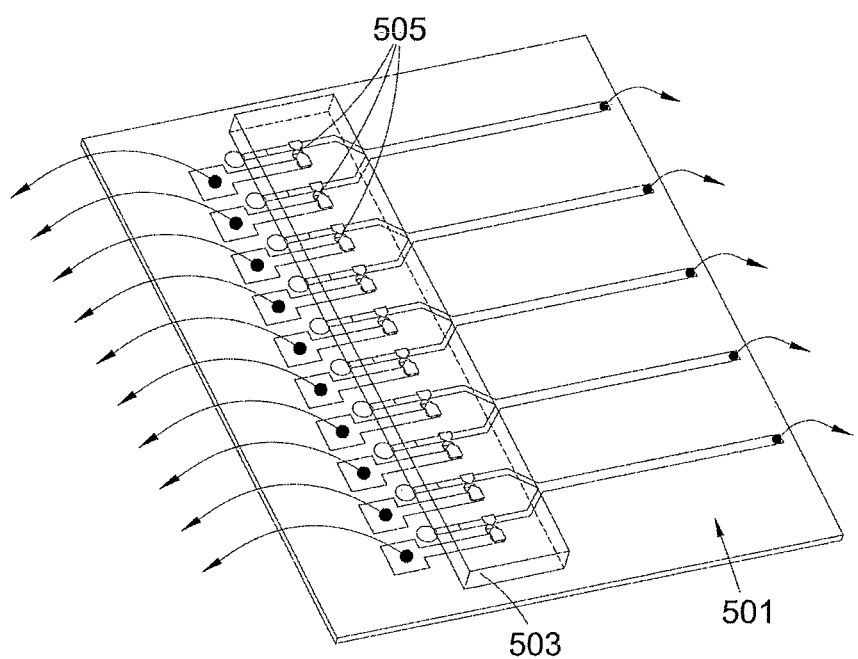
FIG. 14 is a schematic of a multi-channel reflectometer in accordance with an embodiment of the present invention where the photoconductive elements are bonded using a flip-chip technique.

FIG. 14 is a schematic of a multi-channel reflectometer in accordance with an embodiment of the present invention.

The multi-channel system is provided on substrate 501. A multi channel PCE die 503 is provided overlying and in contact with substrate 501. The multi channel PCE die 503 comprises a plurality of photoconductive elements 505 (PCEs) arranged on the under surface of the PCE die 503.

As explained with reference to FIGS. 11 to 13, the PCE die is flip-chip bonded onto substrate 501.

Figure 15:
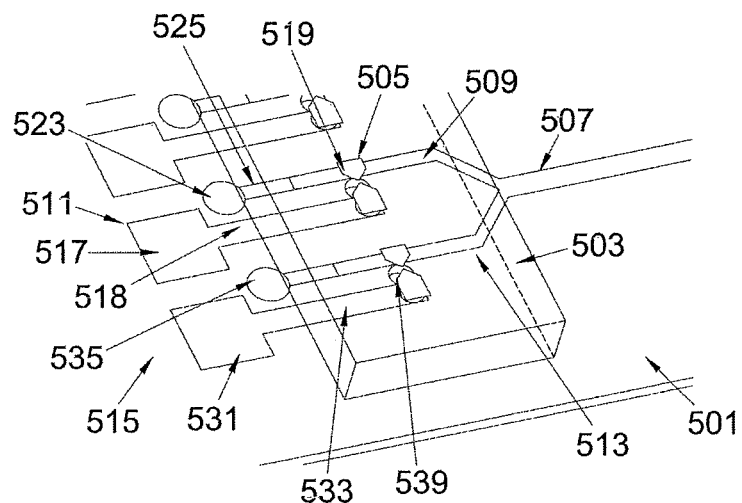
FIG. 15 shows an enlarged region of FIG. 14.

FIG. 15 shows an enlarged area of the substrate 501 of FIG. 14. To avoid any unnecessary repetition, like reference numerals will be used to denote like features. On the surface of substrate 501 there is a Y or V shaped transmission line 507 which leads to a DUT (not shown). The Y shaped transmission line has a first arm 509 which leads to a generator 511 and a second arm 513 which leads to a receiver 515. (Although it will be appreciated that the positions of the generator 511 and the receiver 515 could be reversed).

The generator 511 comprises a bond pad 517 and track 518 which runs parallel to the transmission line first arm 509. There is a hole 519 for illumination 539 provided between the first arm 509 and the track 518. Photoconductive element 505 is positioned on the underside of dye 503. Solder bumps are provided on the parts of the transmission line 509 and the track 518 which are next to hole 519 so that a photoconductive element 505 when turned upside down can be flip-chip bonded across the gap. The photoconductive element 505 is positioned above hole 519 so that it can be illuminated. Transmission line arrangement 509 leads to ground Via 523 through choke resistor 525. The choke resistor 525 functions in exactly the same way as described earlier.

From here, the generated signal is fed to DUT and reflected back into receiving section 515. Receiver 515 also has a bond pad 531 which leads to a track 533 which runs parallel to transmission line 513. Transmission line 513 leads to ground via 535 through choke resistor 537. Track 533 and transmission line 513 run parallel to each other and there is a hole for illumination 539 provided between them. Photoconductive element 505 is then positioned on the underside of dye 503. Solder bumps are provided on the parts of the transmission line 513 and the track 533 which are next to hole 539 so that a photoconductive element 505 when turned upside down can be flip-chip bonded across the gap. The photoconductive element 505 is positioned above hole 539 so that it can be illuminated.

Figure 16:
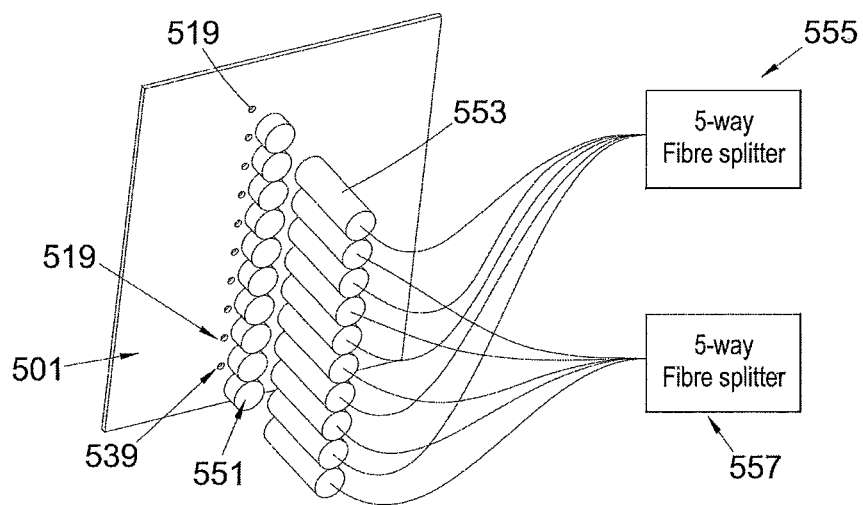
FIG. 16 shows the underside of the reflectometer of FIG. 14 with the optical inputs.

FIG. 16 shows the underside of substrate 501. The illumination holes 539 and 519 can be seen as an array and a lens array is provided in line with the illumination holes 519, 539. A fibre collimator array 553 is then provided aligned with lens array 551 so that each fibre in the fibre collimator array outputs to a lens which then directs the radiation from that fibre through a single hole 519, 539. Two five way fibre splitters are provided, one from the source of the pump beam to provide radiation to the fibres and then to direct radiation through the holes 519 of the generators to excite the photoconductive switches 505 of the generators. The other collimator array 557 provides the probe beam to excite through holes 539 the photoconductive elements 505 of the receivers 515.

This arrangement allows a line of test probes to be formed on a single substrate 501 as shown in FIG. 14. In FIG. 14, five reflectometers are seen arranged one next to the other each with the ability to test a connection. The photoconductive antennas 505 are fabricated on dye 503 and are flip-chip bonded as one unit onto the five reflectometers. Five reflectometers are shown above as an example, the above fabrication technique can be expanded to more reflectometers as required.

In the above embodiments, a choke resistor is used to limit the current flow in order to allow the generation of sub picosecond pulses. However, use of the choke resistor could be avoided by using a semiconductor substrate with carriers which have inherently low carrier lifetimes.

Figure 17A:
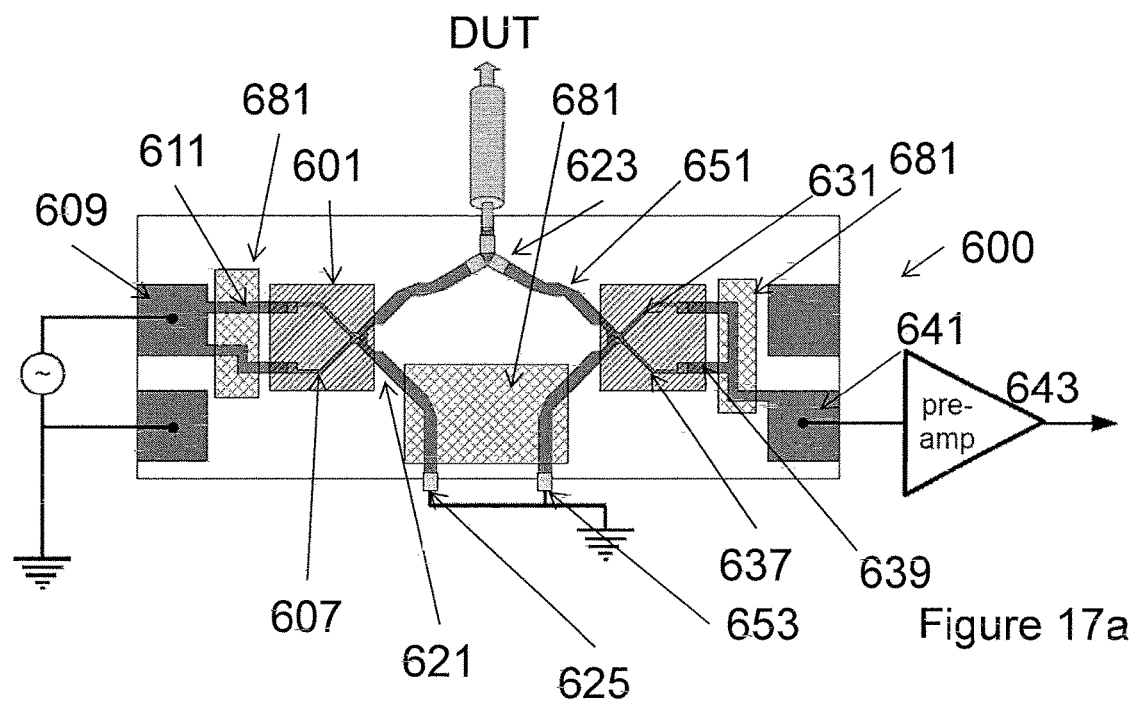
FIG. 17a is a test system in accordance with a further embodiment of the present invention.

FIG. 17*a* shows a reflectometer in accordance with a further embodiment of the invention.

The reflectometer is based on the design as explained with reference to FIGS. 2 to 15. However, there are differences in the arrangement of the photoconductive elements and the transmission lines.

Figure 17B:
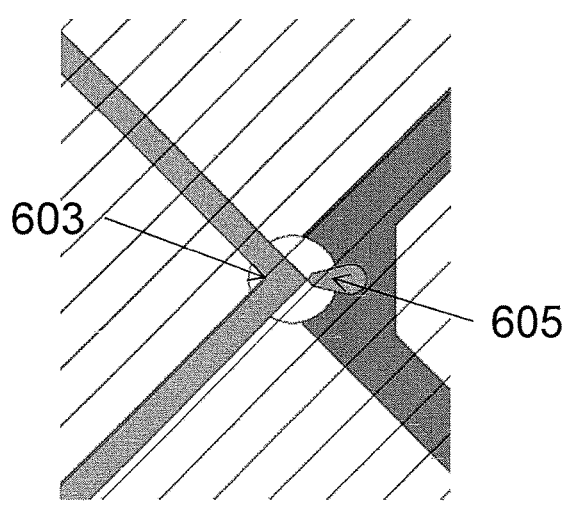

The system comprises a photoconductive element 601 comprising a photoconductive semiconductor substrate. The photoconductive element 601 is shown in more detail in FIG. 17*b*. Here, it can be seen that the photoconductive element comprises a first electrode 603 separated by a photoconductive gap from a second electrode 605. The first electrode 603 and the second electrode 605 are provided on the photoconductive semiconductor substrate. In this particular example, the photoconductive semiconductor material is gallium arsenide with a low carrier lifetime.

The photoconductive element operates in a similar manner to that previously described where a bias is applied across the photoconducting gap and the gap is illuminated with a pump pulse.

The first electrode 603 is connected to the apex of V-shaped connector arrangement 607. The V-shaped connector arrangement 607 comprises a first arm and a second arm. Each arm is connected to an AC bias pad 609. The arms 607 are connected to the AC bias pad via tracks 611.

In the above arrangement, 2 connections, provided by the 2 arms of the V are made to the first electrode 603. Here, the two connections to this low-frequency (LF) side are equivalent. Electrical connection can be made to either terminal. Two terminals can be used if resistors are added on the GaAs in series with the LF connections. The provision of two terminals allows the resistor values to be checked from the resistance between the two LF terminals. However, in the absence of extra resistors, only one device terminal needs to be used.

The second electrode 605 is connected to transmission line 621. Transmission line 621 carries the test signal produced in response to the pump pulse in one direction towards splitter 623 and in the other direction towards termination resistor 625.

Figure 17C:
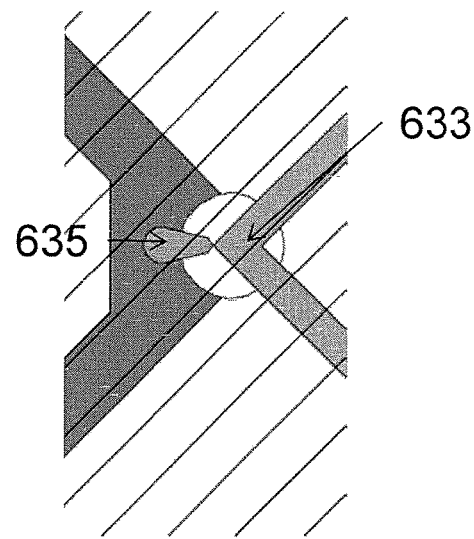

The above has related to producing the test signal for a DUT. A second photoconductive element 631 is provided for detecting the test signal once reflected from the DUT. This is shown in more detail in FIG. 17*c*.

The photoconductive antenna 631 comprises a first electrode 633 opposing a second electrode 635. The first electrode 633 in the second electrode 635 are separated by a gap. The first electrode 633 in the second electrode 635 are located on a photoconductive semiconductor substrate.

The first electrode 633 is connected to the apex of V-shaped connector 637. Connector 637 is connected via connection tracks 639 to output pad 641. Output pad 641 outputs the signal to preamp 643. The processing of the reflected signal pulse is the same as previously described.

The second electrode 635 is connected to transmission line 651. Transmission line 651 at one end is connected to splitter 623 and the other end is connected to terminating resistor 653. Terminating resistor 625 and terminating resistor 653 are both connected to ground.

The splitter 623 takes the output from the photoconductive emitter 601 towards the device under test (DUT) and takes the output from the device under test back to the detector 631.

In an embodiment, the splitter 623 is a "Wye" or "Delta" splitter. An example of a Wye splitter is shown in FIG. 18*a* and an example of a Delta splitter is shown in FIG. 18*b*. In the embodiment described with reference to FIG. 2, a 3-terminal splitter is used which connects the 50 ohm port from the DUT to the two 100 ohm port to the two photoconductors respectively. In the embodiment of FIG. 17*a*, 50 ohm lines are connected to the photoconductors instead of 100 ohm. This low impedance improves the transient response of the circuit.

In a further embodiment, a Wye splitter is used which is fabricated from surface mount resistors designed for microwave operation. In a further embodiment, a Delta-splitter is used fabricated using thin-film processing integrated onto a PCB laminate. Such PCB laminates incorporating thin-film resistors are made using products such as OhmegaPly RCM and Ticer TCR resistive foil.

As before, for a pulse incident on the photoconductive device (from the DUT side), the arrangement prevents back-reflections by providing a matched (i.e. 50 ohm) load at the device. In the earlier embodiments, the matching resistor is provided at the device. In this embodiment, the load is provided using another length of microstrip. The device doesn't contribute to the load on the microstrip so an incident pulse travels on past the device down the additional "terminating" length of microstrip. In order to prevent the pulse from reflecting off the end of this new section of transmission line, a terminating resistor is used. The benefit here is that the termination resistor can be physically distant from the photoconductive element, thus conventional thin-film "chip" resistors can be used as opposed to fabricating thin film resistors on the semiconductor of the photoconductive antenna. Thus, the system of FIG. 17 is easier to fabricate.

The connectors 611, part of the transmission line extending towards the terminating resistor 625 and 653 and also the connectors 639 are covered by RF absorbing material 681. The RF absorber 681 suppresses ringing due to transient propagation across the metal structures on the semiconductor devices.

The absorber is placed over the metal structures of the TPR device forming the low frequency components of the circuit. In this embodiment, it is not placed over the high frequency side of the device to avoid attenuating the pulse on the HF side.

In this embodiment, the RF absorbing material is placed over the low frequency components such as the biasing electrodes and grounds.

An example of a suitable microwave absorber product is Wurth Electronik WE-FAS Flexible Absorber Sheets. These comprise a composite polymer sheet loaded with magnetically permeable particles (ferrite or ferrous metal) to create high attenuation in the GHz region and above. Preferably, sheets have thickness 100 μm to 300 μm. Thickness in the range 10 μm to 3 mm may have benefit. Absorbing material may alternatively be applied as a colloid or paint or by some other application method.

FIG. 19 shows the microstrip layout 667 of the system described with reference to FIG. 17a on a microstrip substrate 661. In this embodiment, the microstrips are made out of copper tracks.

The photoconductive elements 601 and 631 are flip chip bonded to the microstrips 667. The electrodes 603, 605, 633 and 635 along with the V shaped connectors are formed on a surface of the photoconductive substrate. The photoconductive substrate is then turned over such that the electrodes and connecters on the photoconducting material face the microstrips on the substrate.

The performance of the above system can be improved by reducing the self-capacitance of the metal structures on the semiconductor substrate. The dielectric constant of the semiconductors is high (>12 for both Si and GaAs), enhancing the capacitance of even the smallest electrode structures. This capacitance then broadens the electric transient generated by the laser pulse, according to the RC-time-constant of the load circuit.

Although the electrode is made as small as practically possible on the GaAs, a substantial performance improvement would be gained by using a low-dielectric constant substrate for the photoconductor. This can be achieved using a process of "epitaxial liftoff" to transfer a very thin (<10 μm) layer of photoconductive material off its original substrate and on to some other material. By choosing a new substrate material with low dielectric constant (such as glass, quartz, sapphire), improve performance can be obtained. Additionally, an optically transparent substrate provides an alternative means of exciting the photoconductor optically, by directing the laser pulse through the substrate material.

Holes 663 through the microstrip substrate are shown. These provide optical access to the photoconductors for the pump pulse from an excitation laser.

When photoconductive elements are mounted in a flip-chip configuration, the microstrip waveguide must pass under the edge of the semiconductor die to reach the photoconductor electrode(s). The presence of the die above the microstrip increases the effective capacitance-per-unit-length of the microstrip. In order to maintain a constant transmission-line impedance as the microstrip passes under the die, its track width is reduced to compensate for the capacitance-enhancing effect of the die. For a GaAs substrate placed 25 μm above a 50 ohm microstrip formed on 130 μm high PTFE laminate material of $E_r$=2.2, it has been found that the capacitance is increased by 40%. Thus, in this embodiment, the microstrip is narrowed where is runs under the GaAs die in order to reduce its capacitance to the same value as expect away from the die.

Regions of microstrip track 665 which have been narrowed to compensate for the high-dielectric constant GaAs above it are shown.

Figure 20:
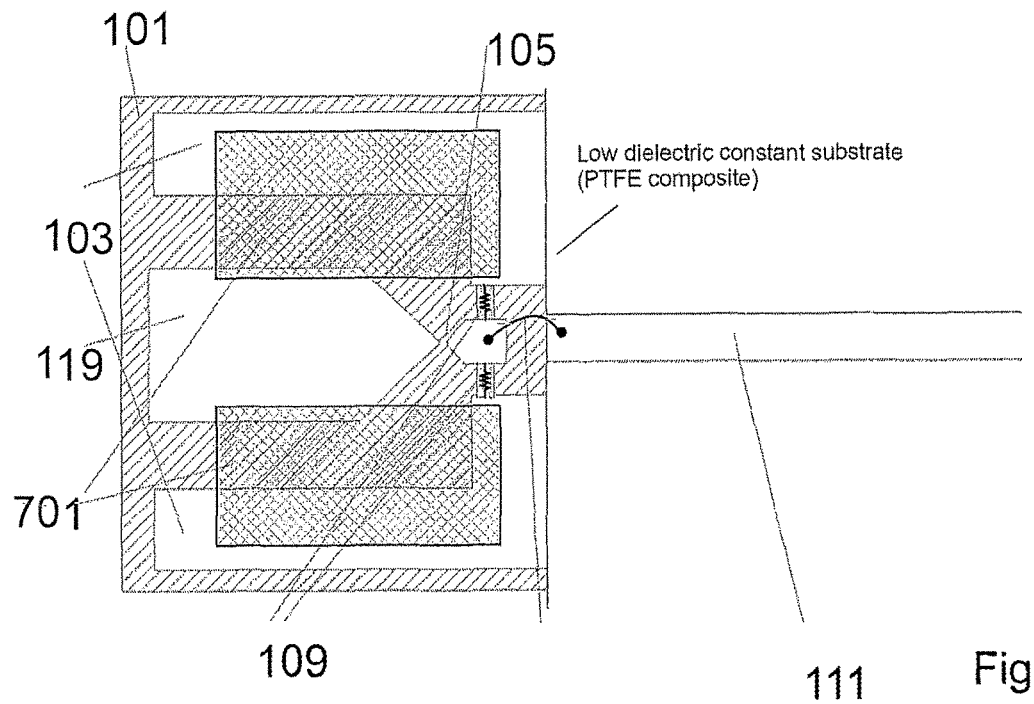
FIG. 20 is a schematic of the element of FIG. 5 with RF absorbing material.

FIG. 20 shows the embodiment of FIG. 5 with the RF absorber 701 used to provide additional suppression of back-reflections from the transmission line resistive termination. In other words, it is assumed that the termination will not be perfect particularly at the highest frequencies. The addition of the absorber over the terminated line will kill off any residual reflections. To avoid any unnecessary repetition, like reference numerals are used to denote like features.

Figure 21:
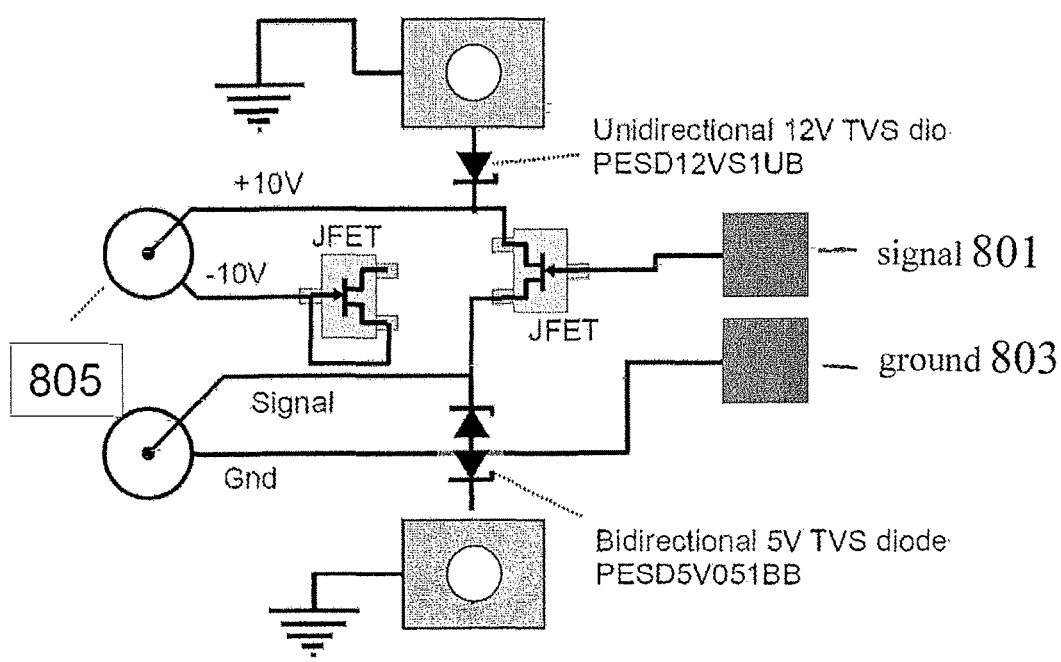
FIG. 21 is a schematic of the photoconductive detector circuit for use in a system in accordance with an embodiment of the present invention having a TVS diode.

FIG. 21 is a schematic using transient voltage suppression (TVS) diodes to the unit housing, the photo-conductive elements and microwave transmission line. This protects the photoconductive elements from damage due to ESD coupled in from the rest of the measurement system.

The photoconductive elements are extremely sensitive to electro-static discharge (ESD) damage. This susceptibility follows from the high impedance of the devices and their low capacitance. While the signal input line to/from the DUT cannot be protected from ESD without seriously degrading high frequency performance (the circuit is designed for the propagation of high frequency transients hence any means of filtering such transient would render the device unfit for purpose). However, it transpires that the majority of ESD damage to these system arises from the coupling of electro-magnetic transient (due to an electro-static discharge) into the supporting circuitry. This to propagated to the photoconductors via the low-frequency signal & power connections to the device.

Transient suppression diodes places on the connections to the devices prevent damage from such transients. Note: in the case of the pulse receiver, the TVS diode is not connected to the signal output directly from the photoconductor, but two diodes are placed to protect the outward side of the JFET which buffers the photoconductor signal.

FIG. 21 shows the JFET pre-amp design used to buffer the receiver photoconductor signal. The signal and ground connections 801 and 803 are to the electrodes on the photoconductive element. Both the power connections 805 and the signal output lines are protected. In the case of the emitter device (not shown), only a single TVS diode is required and it can be placed directly across the bias-connection to the photoconductor. Typically, a TVS diode with a larger stand-off voltage is required for the emitter in view of the large bias voltage applied to it.

The invention claimed is:

1. A reflectometer for allowing a test of a device, the reflectometer comprising:
   a source of pulsed radiation;
   a first photoconductive element configured to output a pulse in response to irradiation from the source of pulsed radiation;
   a choke resistor arranged such that the first photoconductive element is biased through the choke resistor, the choke resistor having a resistance of at least 100Ω;
   a second photoconductive element configured to receive a pulse, wherein the second photoconductive element is configured as a receiver;
   a transmission line arrangement configured to direct the pulse from the first photoconductive element to a device under test and to direct the pulse reflected from the device under test to the second photoconductive element, such that the second photoconductive element receives the pulse reflected from the device under test;
   an amplifier configured to amplify the output of the second photoconductive element; and
   a unit configured to provide an input AC impedance of at least 100,000 ohm at the AC bias frequency to the amplifier.

2. The reflectometer of claim 1, wherein a path length from the first photoconductive element to the second photoconductive element is substantially shorter than a path length from the first photoconductive element to the device under test to the second photoconductive element.

3. The reflectometer of claim 1, wherein the transmission line arrangement is provided on a substrate with a maximum dielectric constant of 10.

4. The reflectometer of claim 1, wherein:
   the first photoconductive element is configured as a generator which receives a pump beam of radiation,
   the receiver receives a probe beam of radiation,
   the pump beam and probe beam are emitted from the same source,
   the reflectometer further comprises a delay line configured to vary a path length of the pump beam relative to a path length of the probe beam.

5. The reflectometer of claim 4, wherein the delay line comprises a fast scanning delay section and a slow scanning delay section, wherein the fast scanning delay section is provided by an oscillating rhomboid and the slow scanning delay section comprises a linear delay line.

6. The reflectometer of claim 1, wherein the first photoconductive element is configured as a generator, the reflectometer further comprising an AC bias unit to provide an AC bias to the generator and a phase sensitive detection unit configured to perform phase-sensitive detection on the signal measured directly from the receiver.

7. The reflectometer of claim 1, wherein the first photoconductive element and the first photoconductive element are coupled to the transmission line arrangement by wire bonds or ribbon bonds.

8. The reflectometer of claim 1, wherein the first photoconductive element and the first photoconductive element comprise GaAs, InP, GaInAs, or another III-V alloy.

9. A method of performing a reflectometry test on a device, the method comprising:
   providing a source of pulsed radiation;
   providing a first photoconductive element configured to output a pulse in response to irradiation from the source of pulsed radiation;
   providing a choke resistor arranged such that the first photoconductive element is biased through the choke resistor, the choke resistor having a resistance of at least 100Ω;
   providing a second photoconductive element configured to receive a pulse, wherein the second photoconductive element is configured as a receiver;
   directing the pulse from the first photoconductive element to a device under test and directing the pulse reflected from the device under test to the second photoconductive element, such that the second photoconductive element receives the pulse reflected from the device under test;
   amplifying the output of the second photoconductive element using an amplifier; and
   providing an input AC impedance of at least 100,000 ohm at the AC bias frequency to the amplifier.

* * * * *